(12) United States Patent
Yang et al.

(10) Patent No.: US 12,205,649 B2
(45) Date of Patent: Jan. 21, 2025

(54) NON-VOLATILE MEMORY DEVICES AND DATA ERASING METHODS

(71) Applicant: YANGTZE MEMORY TECHNOLOGIES CO., LTD., Hubei (CN)

(72) Inventors: Tao Yang, Hubei (CN); Dongxue Zhao, Hubei (CN); Lei Liu, Hubei (CN); Kun Zhang, Hubei (CN); Wenxi Zhou, Hubei (CN); Zhiliang Xia, Hubei (CN); Zongliang Huo, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 115 days.

(21) Appl. No.: 17/950,931

(22) Filed: Sep. 22, 2022

(65) Prior Publication Data
US 2024/0105266 A1 Mar. 28, 2024

(51) Int. Cl.
 *G11C 16/16* (2006.01)
 *G11C 16/04* (2006.01)
(52) U.S. Cl.
 CPC .......... *G11C 16/16* (2013.01); *G11C 16/0483* (2013.01)
(58) Field of Classification Search
 CPC .................................................... G11C 16/16
 See application file for complete search history.

(56) References Cited

U.S. PATENT DOCUMENTS

| | | | | |
|---|---|---|---|---|
| 2012/0134210 A1* | 5/2012 | Maeda | .................... | G11C 16/10 365/185.11 |
| 2013/0248974 A1* | 9/2013 | Alsmeier | ................ | G11C 16/04 438/264 |
| 2014/0247661 A1* | 9/2014 | Costa | ................... | G11C 11/5635 365/185.11 |
| 2015/0155047 A1* | 6/2015 | Kim | ...................... | G11C 16/107 365/185.29 |
| 2016/0093636 A1* | 3/2016 | Pang | ...................... | H10B 43/27 257/324 |
| 2016/0217868 A1* | 7/2016 | Dutta | .................. | G11C 16/0483 |
| 2018/0151230 A1* | 5/2018 | Park | ....................... | G11C 16/32 |
| 2018/0188958 A1* | 7/2018 | Kim | ....................... | G06F 3/0655 |
| 2021/0327805 A1* | 10/2021 | Lee | ......................... | H10B 41/35 |

* cited by examiner

*Primary Examiner* — Douglas King
(74) *Attorney, Agent, or Firm* — Conley Rose, P.C.

(57) ABSTRACT

A method for data erasing of a non-volatile memory device is disclosed. The memory includes multiple memory cell strings each including a select gate transistor and multiple memory cells that are connected in series. The method comprises applying a step erase voltage to one memory cell string for an erase operation, the step erase voltage having a step-rising shaped voltage waveform. The method further comprises, during a period when the step erase voltage rises from an intermediate level to a peak level, raising a voltage of the select gate transistor from a starting level to a peak level, and raising a voltage of a predetermined region from a starting level to a peak level, such that a gate-induced drain leakage current is generated in the one memory cell string. The predetermined region is adjacent to the at least one select gate transistor and includes at least one memory cell.

23 Claims, 13 Drawing Sheets

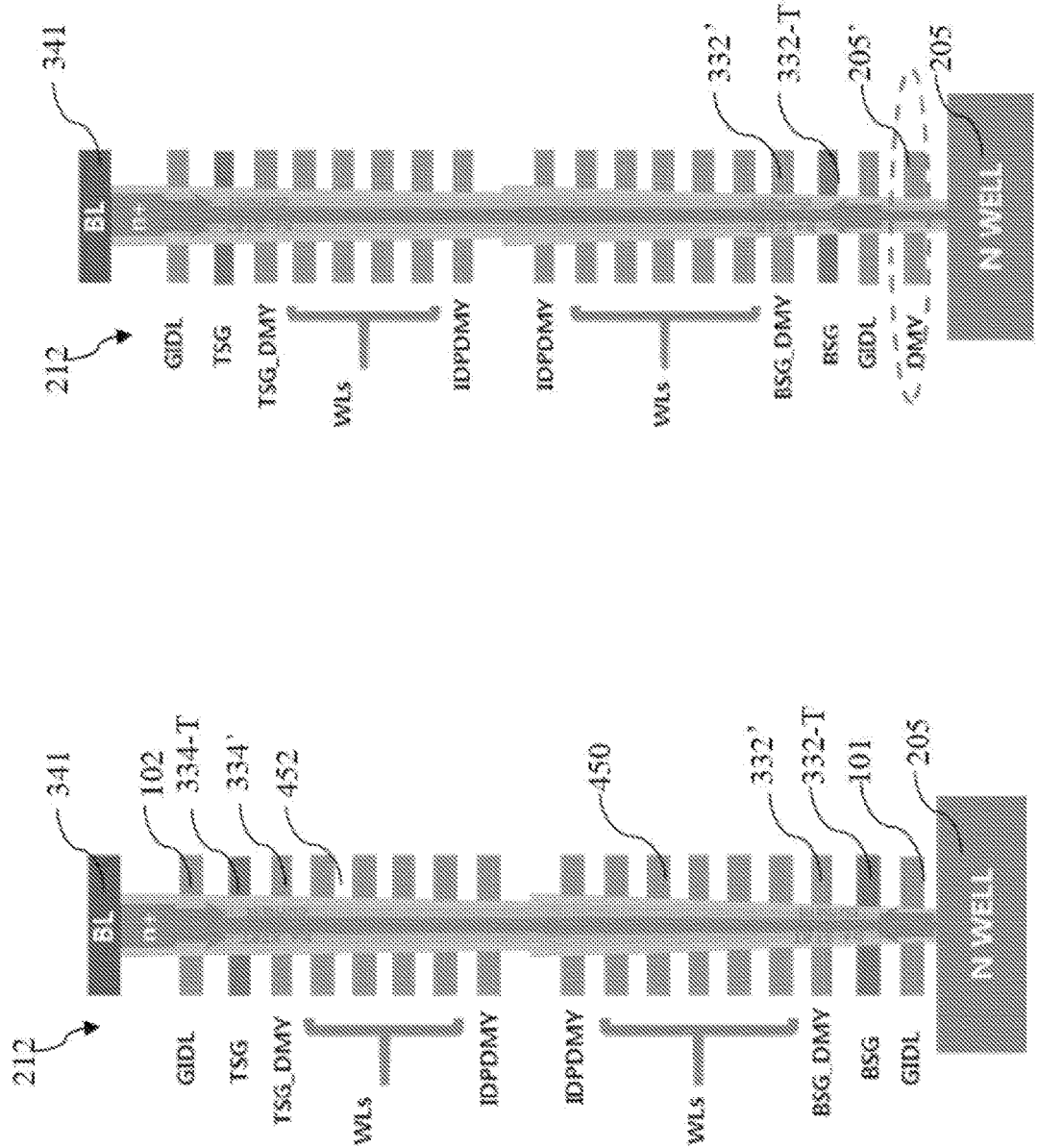

NON-VOLATILE MEMORY DEVICES AND DATA ERASING METHODS

TECHNICAL FIELD

The present disclosure generally relates to the field of semiconductor technology, and more particularly, to non-volatile memory devices and data erasing methods of the non-volatile memory devices.

BACKGROUND

Recently, non-volatile memories having memory cells stacked "vertically" (i.e., in three dimensions (3D)) are widely used in electronic devices. A non-volatile memory device can usually include multiple vertically stacked levels, such as a top level and a bottom level formed by a double-stack process. Each level can include multiple vertically stacked memory cells. In order to achieve effective reading, writing, and erase operations in a nonvolatile memory device having multiple levels, each level must enable erase operations individually.

Further, with the continuous increasing of the number of stacked layers of the nonvolatile memory devices, the connection mode of channel layer bottom structure has evolved from traditional selective epitaxial structure to lateral connection mode or bottom connection mode. By forming a highly doped semiconductor layer (which usually has the same type of doping impurities as the channel layer) at the bottom of channel layer as a connecting structure, the non-volatile memory devices manufactured by the existing forming method are not suitable for volume erase operations. Therefore, gate-induced drain leakage (GIDL) is introduced to generate auxiliary body bias to assist erase operations in each level to achieve data erasing of non-volatile memory devices.

Accordingly, it is desired to increase the efficiency of level erase operations and GIDL erase operations for non-volatile memory devices.

BRIEF SUMMARY

Implementations of a three-dimensional (3D) memory device are described in the present disclosure.

One aspect of the present disclosure provides a method for data erasing of a non-volatile memory device. The memory includes a plurality of memory cell strings each including at least one select gate transistor and a plurality of memory cells that are connected in series. The method comprises applying a step erase voltage to one memory cell string for an erase operation, the step erase voltage having a step-rising shaped voltage waveform. The method further comprises, during a period when the step erase voltage rises from an intermediate level of the step erase voltage to a peak level of the step erase voltage, raising a voltage of the at least one select gate transistor from a starting level of the at least one select gate transistor to a peak level of the at least one select gate transistor, and raising a voltage of a predetermined region from a starting level of the predetermined region to a peak level of the predetermined region, such that a gate-induced drain leakage current is generated in the one memory cell string. The predetermined region is adjacent to the at least one select gate transistor and includes at least one of the plurality of memory cells.

In some implementations, the at least one select gate transistor includes a top select gate (TSG) transistor connected to a bit line and/or a bottom select gate (BSG) transistor connected to a well doped region in a substrate, and the predetermined region includes a first predetermined region and a second predetermined region, wherein the first predetermined region is adjacent to the BSG transistor and includes at least one of the plurality of the memory cells, and the second predetermined region is adjacent to the TSG transistor and includes at least one of the plurality of memory cells.

In some implementations, raising the voltage of the at least one select gate transistor and raising the voltage of the predetermined region comprises: during a period in which the voltage of the at least one select gate transistor is raised from the starting level of the at least one select gate transistor to the peak level of the at least one select gate transistor, raising the voltage of the predetermined region from the starting level of the predetermined region to the peak level of the predetermined region.

In some implementations, raising the voltage of the at least one select gate transistor and raising the voltage of the predetermined region comprises: simultaneously raising the voltage of the at least one select gate transistor from the starting level of the at least one select gate transistor to the peak level of the at least one select gate transistor and raising the voltage of the predetermined region from the starting level of the predetermined region to the peak level of the predetermined region, where in the peak level of the at least one select gate transistor is equal to the peak level of the predetermined region.

In some implementations, raising the voltage of the at least one select gate transistor and raising the voltage of the predetermined region comprises: after raising the voltage of the at least one select gate transistor from the starting level of the at least one select gate transistor, raising the voltage of the predetermined region from the starting level of the predetermined region.

In some implementations, the plurality of memory cells include at least one dummy memory cell; the at least one dummy memory cell further comprises at least one first dummy memory cell located between the BSG transistor and the well doped region; and the first predetermined region is adjacent to the BSG transistor and includes the at least one dummy memory cell, and is spaced from the substrate by the at least one first dummy memory cell.

In some implementations, the method further comprises setting the at least one of the first dummy memory cell to a floating state during the erase operation.

In some implementations, the method further comprises applying another step erase voltage to the at least one of the first dummy memory cell.

In some implementations, the at least one dummy memory cell further includes at least one select level dummy memory cell adjacent to the at least one select gate transistor.

In some implementations, the method further comprises during the period when the step erase voltage rises from the intermediate level to the peak level, raising the voltage of the at least one select level dummy memory cell from the starting level of the at least one select level dummy memory cell to a peak level of the at least one select level dummy memory cell.

In some implementations, the method further comprises, during the period when the voltage of the at least one select gate transistor is raised from the starting level of the at least one select gate transistor to the peak level of the at least one select gate transistor, raising the voltage of the at least one select level dummy memory cell from the starting level of the at least one select level dummy memory cell to the peak level of the at least one select level dummy memory cell.

In some implementations, the method further comprises raising simultaneously, the voltage of the at least one select gate transistor from the starting level of the at least one select gate transistor to the peak level of the at least one select gate transistor, and the voltage of the at least one select level dummy memory cell from the starting level of the at least one select level dummy memory cell to the peak level of the at least one select level dummy memory cell.

In some implementations, the method further comprises, after raising the voltage of the at least one select gate transistor from the starting level of the at least one select gate transistor, raising the voltage of the at least one select level dummy memory cell from the starting level of the at least one select level dummy memory cell.

In some implementations, raising the voltage of the at least one select gate transistor and raising the voltage of the predetermined region comprises: during a period when a voltage of the BSG transistor is raised from a starting level of the BSG transistor to a peak level of the BSG transistor, raising a voltage of the first predetermined region is raised from a starting level of the first predetermined region to a peak level of the first predetermined region; and during a period when the voltage of the TSG transistor from a starting level of the TSG transistor to a peak level of the TSG transistor, raising a voltage of the second predetermined region from a starting level of the second predetermined region to a peak level of the second predetermined region.

In some implementations, raising the voltage of the at least one select gate transistor and raising the voltage of the predetermined region comprises: after raising the voltage of the BSG transistor from the starting level of the BSG transistor, raising the voltage of the first predetermined region from the starting level of the first predetermined region; and raising simultaneously, the voltage of the TSG transistor from the starting level of the TSG transistor to the peak level of the TSG transistor, and the voltage of the second predetermined region from the starting level of the second predetermined region to the peak level of the second predetermined region.

In some implementations, raising the voltage of the at least one select gate transistor and raising the voltage of the predetermined region comprises: raising simultaneously, the voltage of the BSG transistor from the starting level of the BSG transistor to the peak level of the BSG transistor, and the voltage of the first predetermined region from the starting level of the first predetermined region to the peak level of the first predetermined region; and after raising the voltage of the TSG transistor from the starting level of the TSG transistor, raising the voltage of the second predetermined region from the starting level of the second predetermined region.

In some implementations, raising the voltage of the at least one select gate transistor and raising the voltage of the predetermined region comprises: raising simultaneously, the voltage of the BSG transistor from the starting level of the BSG transistor to the peak level of the BSG transistor, and the voltage of the first predetermined region from the starting level of the first predetermined region to the peak level of the first predetermined region; and raising simultaneously, the voltage of the TSG transistor from the starting level of the TSG transistor to the peak level of the TSG transistor, and the voltage of the second predetermined region from the starting level of the second predetermined region to the peak level of the second predetermined region.

In some implementations, raising the voltage of the at least one select gate transistor and raising the voltage of the predetermined region comprises: after raising the voltage of the BSG transistor from the starting level of the BSG transistor, raising the voltage of the first predetermined region from the starting level of the first predetermined region; and after raising the voltage of the TSG transistor from the starting level of the TSG transistor, raising the voltage of the second predetermined region from the starting level of the second predetermined region.

Another aspect of the present disclosure provides a non-volatile memory device, comprising: a memory array formed on a well doped region of a substrate, comprising a plurality of blocks, wherein each block includes a plurality of memory cell strings each including a plurality of memory cells connected in series to a corresponding bit line, and each block include one or more levels stacked vertically in a direction perpendicular to the substrate; and a peripheral circuit coupled to the memory array and configured to control a level selection of the plurality of levels, and to perform the level erase operation and the level described above to the selected level.

In some implementations, the memory array is a three-dimensional NAND memory array, and the non-volatile memory device is a three-dimensional NAND memory device.

In some implementations, each block include two levels stacked vertically in the direction perpendicular to the substrate.

In some implementations, each block include three or more levels stacked vertically in the direction perpendicular to the substrate.

Another aspect of the present disclosure provides a memory system, comprising: a memory device described above, and; a controller coupled to the memory device and configured to control the memory device to store data.

Another aspect of the present disclosure provides an electronic device, comprising: the memory device described above.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate implementations of the present disclosure and, together with the description, further serve to explain the principles of the present disclosure and to enable a person skilled in the pertinent art to make and use the present disclosure.

FIG. 5 is a partial circuit structure diagram of a non-volatile memory device according to some implementations of the present disclosure.

FIG. 6 is a partial circuit structure diagram of a non-volatile memory according to some other implementations of the present disclosure.

Figure 1:
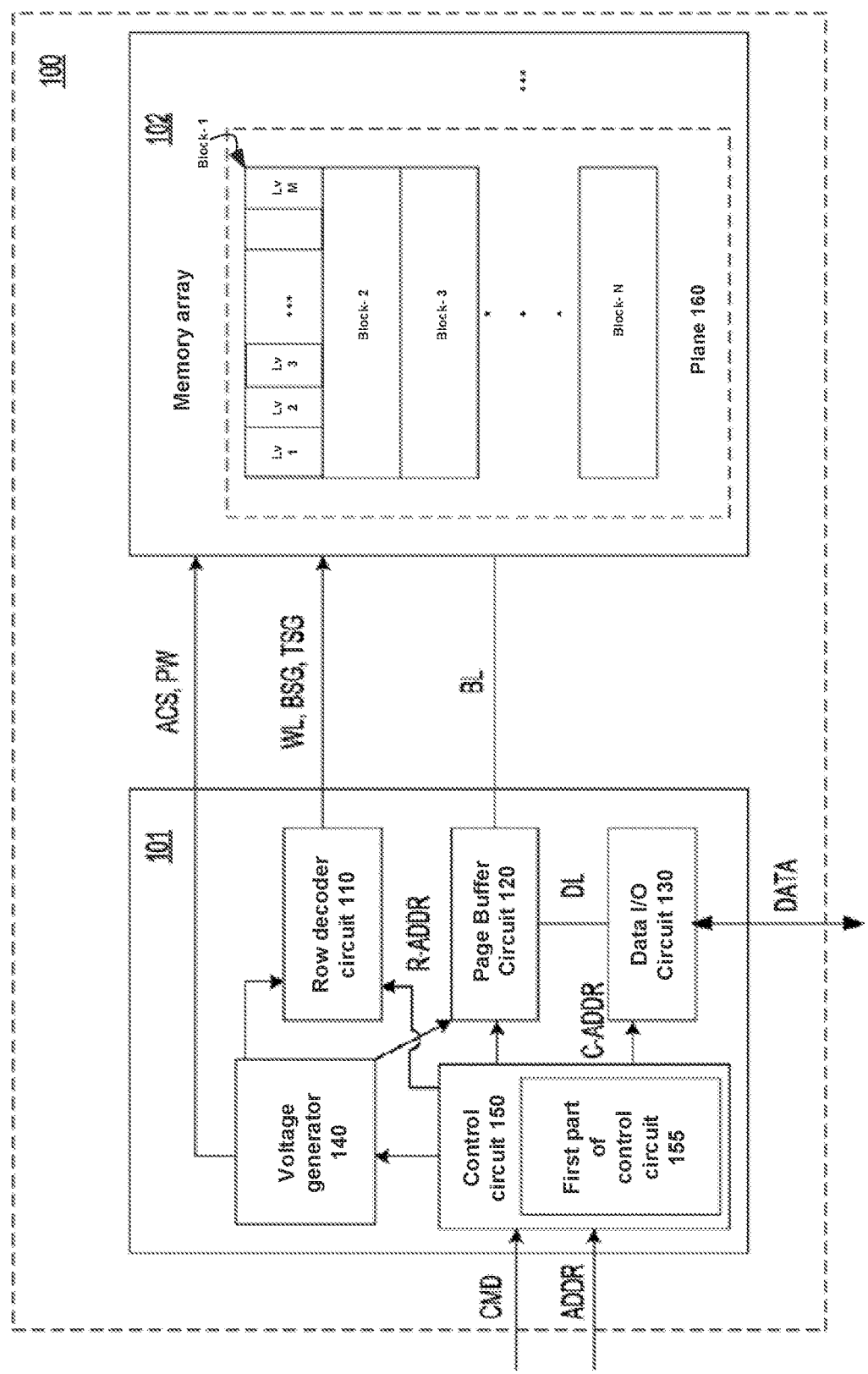
FIG. 1 shows a block diagram of a non-volatile memory device according to some implementations of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Implementations of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other disclosures.

It is noted that references in the specification to "one implementation," "an implementation," "an example implementation," "some implementations," etc., indicate that the implementation described can include a particular feature, structure, or characteristic, but every implementation can not necessarily include the particular feature, structure, or characteristic. Moreover, such phrases do not necessarily refer to the same implementation. Further, when a particular feature, structure or characteristic is described in connection with an implementation, it would be within the knowledge of a person skilled in the pertinent art to affect such feature, structure or characteristic in connection with other implementations whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may instead, allow for existence of additional factors not necessarily expressly described, again, depending at least in part on context.

It should be readily understood that the meaning of "on," "above," "over," "connected to" or "coupled to" in the present disclosure should be interpreted in the broadest manner such that "on" not only means "directly on" something, but also includes the meaning of "on" something with an intermediate feature or a layer therebetween. Moreover, "above," "over," "connected to" or "couple to" not only means "above," "over," "connected to" or "couple to" something, but can also include the meaning it is "above," "over," "connected to" or "couple to" something with no intermediate feature or layer therebetween (i.e., directly on something). If an element or layer is referred to as being "directly on/above/over," "directly connected to" or "directly coupled to" another element or layer, there is no intervening element or layer. Further, the term "connected to" may refer to physical, electrical, and/or fluid connections with or without intervening elements.

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

Throughout the specification, the same reference numerals can denote the same components. In the drawings, the thickness of layers and regions are exaggerated for clarity.

As used herein, the terms "first," "second," etc., used describe various elements do not limit the scope of the elements. For example, these terms can be used to distinguish one element from another element. Therefore, without departing from the teaching of one or more implementations, "a first level" discussed below may be referred to as "a second level." Describing an element as "a first element" may not require or imply the presence of "a second element" or other elements. The terms "first," "second," etc., may also be used herein to distinguish different types or groups of elements. For the sake of brevity, the terms "first," "second," etc., may respectively mean "first type (or first group)," "second type (or second group)," etc.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 3-15% of the value (e.g., ±5%, ±10% of the value).

FIG. 1 shows a block diagram of a non-volatile memory 100 according to some implementations of the present disclosure. As shown in FIG. 1, the non-volatile memory 100 includes a peripheral circuit 101 and a memory array 102 coupled with the peripheral circuit 101. In some implementations, the peripheral circuit 101 and the memory array 102 can be arranged on a single chip. In some other implementations, the memory array 102 can be arranged on an array chip, and the peripheral circuit 101 can be arranged on a different chip. For example, the peripheral circuit 101 can be arranged on a complementary metal oxide semiconductor (CMOS) chip implemented by using CMOS technology. The array chip and the CMOS chip can be electrically coupled together by a bonding processes. In some implementations, the non-volatile memory 100 can be an integrated circuit (IC) package that packages one or more array chips and CMOS chips.

The non-volatile memory 100 can be configured to store data in the memory array 102 and perform operations in response to receiving one or more commands (CMD). In some implementations, the non-volatile memory 100 can receive one or more of write commands, read commands, erase commands, etc., and can perform the one or more operations accordingly.

In some implementations, the non-volatile memory 100 can receive an erase command with an address, and then can reset one or more memory cells according to the address to an unprogrammed state (also referred as erased sate), such as a "1" sate for NAND memory cells.

In some implementations, the memory array 102 may include one or more planes 160, and each plane 160 can include multiple blocks (e.g., block-1 . . . block-N as shown in FIG. 1). Each block can include multiple levels stacked vertically (e.g., level-1 . . . level-M in block-1 as shown in FIG. 1). In some implementations, concurrent operations can be performed at different planes 160. In some implementations, each level of level-1 to level-M can be a basic unit for performing an erase operation.

In some implementations, the memory array 102 can be a flash memory array, such as a 3D NAND flash memory array. In some implementations, the peripheral circuit 101 includes a row decoder circuit 110, a page buffer circuit 120, a data input/output (I/O) circuit 130, a voltage generator 140, and a control circuit 150 that are coupled with each other. The row decoder circuit 110 can receive an address, such as a row address (R-ADDR), and generate word line (WL) signals and select signals (e.g., top select gate (TSG) signals, bottom select gate (BSG) signals) based on the R-ADDR, etc.), and provide the WL signals and selection signals to the memory array 102. During the erase operation, the row decoder circuit 110 can provide appropriate WL signals and selection signals.

The page buffer circuit 120 cam be coupled to the bit lines (BLs) of the memory array 102 and can be configured to buffer data during read operations and write operations. The data I/O circuit 130 can be coupled to the page buffer circuit 120 via one or more data lines (DLs). In some examples (e.g., during a write operation), the data I/O circuit 130 can be configured to receive data from an external circuit of the non-volatile memory 100 and transmit the received data to the memory array 102 through the page buffer circuit 120.

The voltage generator 140 can be configured to generate various voltage levels for various operations of the non-volatile memory 100. For example, during a data erase operation, the voltage generator 140 can generate different voltage levels for the bit line voltages, well doped region voltages, various word line voltages, selection voltages, predetermined region voltages, etc. During a data erase operation, the voltage generator 140 can contribute to provide a step erase voltage to the well doped region of the memory array 102. During a data erase operation, the voltage generator 140 can further contribute to provide a step erase auxiliary voltage to the row decoder circuit 110, such that the row decoder circuit 110 can output the top selection gate signals during the data erase operation. During a data erase operation, the voltage generator 140 can further provide peak voltages of predetermined regions to the row decoder circuit 110, such the row decoder circuit 110 can output predetermined region signals during the data erase operation. During a data erase operation, the voltage generator 140 can further contribute to provide a step erase voltage to the page buffer circuit 120, such the page buffer circuit 120 can drive the bit lines (BLs) during the data erase operation. In some other implementations, the voltage generator 140 can contribute to provide the step erase voltage to the bit lines without passing through the page buffer circuit 120.

The control circuit 150 can be configured to receive commands (CMD) and addresses (ADDR). Based on the command and address, the control circuit 150 can be configured to provide control signals to the row decoder circuit 110, the page buffer circuit 120, the data I/O circuit 130, and the voltage generator 140 and other circuits. For example, the control circuit 150 can generate row addresses R-ADDR and column addresses C-ADDR based on the addresses ADDR, provide the row addresses R-ADDR to the row decoder 110, and provide the column addresses to the data I/O circuit 130. As another example, the control circuit 150 can control the voltage generator 140 to generate different voltage levels based on the received CMDs. The control circuit 150 can coordinate other circuits to provide signals with appropriate timing and voltage levels to the memory array 102.

The control circuit 150 can include a first part of the control circuit 155 configured to generate control signals to control other circuits to provide appropriate signals to the memory array 102 to perform erase operations which use hierarchical erasing mechanism and GIDL erasing mechanism. That is, the first part control circuit 155 can be a control circuit for a hybrid erasing mechanism combining the hierarchical erasing and the GIDL erasing. Control signals with appropriate timing and voltage levels for the memory array 102 can use the hierarchical erasing mechanism and the GIDL erasing mechanism for the data erase operations of the non-volatile memory. The waveforms of such control signals are described in detail below with reference to FIGS. 4 to 12.

The control circuit 150 can be provided in the peripheral circuit 101. The control logic 150 as well as the first part of the control circuit 155 described herein can be implemented by a processor capable of running a software module and/or a firmware module, such as a microcontroller unit (MCU), or a hardware module of a finite-state machine (FSM), such as an integrated circuit (IC, e.g., application-specific IC (ASIC), field-programmable gate array (FPGA), etc.), or a combination of them.

Figure 2:
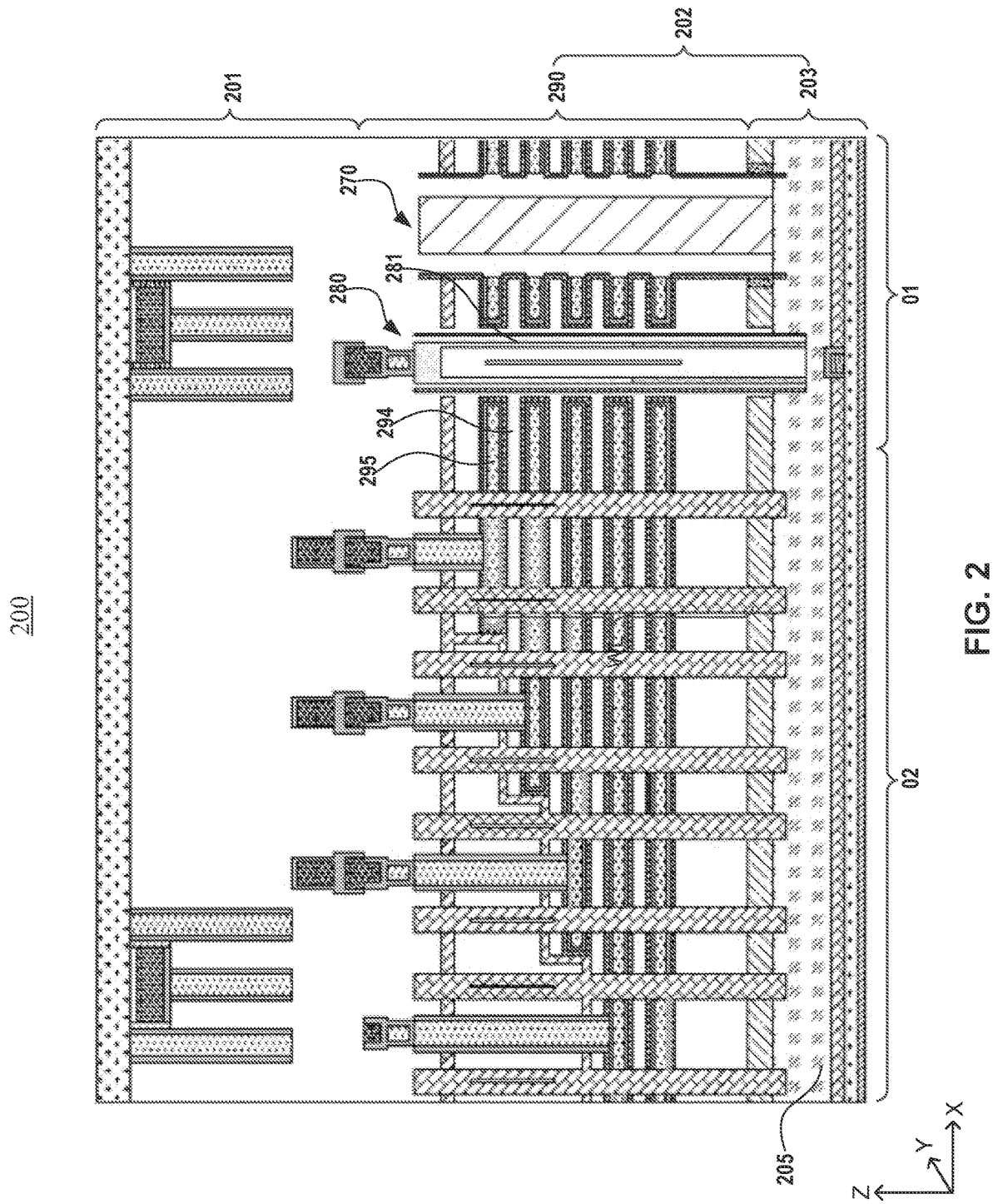
FIG. 2 shows a cross-sectional view of a partial structure of a non-volatile memory device according to some implementations of the present disclosure.

FIG. 2 shows a cross-sectional view of a partial structure of non-volatile memory 200 according to some implementations of the present disclosure. As shown in FIG. 2, in some implementations of the present disclosure, the non-volatile memory 200 can include a three-dimensional (3D) memory array chip 202 and a peripheral circuit chip 201 that are electrically coupled together, e.g., by a bonding process.

In some implementations, the non-volatile memory 200 can include a plurality of memory array chips 202 and a plurality of peripheral circuit chips 201. The memory array chip 202 includes a substrate 203 and a stack structure 290 formed on the substrate 203. The peripheral circuit chip 201 can include a substrate and a peripheral circuit formed on the substrate. It is noted that, in the following description, X-Y plane is a plane parallel to the main surface of the substrate 203, and Z direction is perpendicular to the main surface of the substrate 203.

The substrate 203 and the substrate of the peripheral circuit chip 201 can be any suitable substrates, such as silicon (Si) substrates, germanium (Ge) substrates, silicon germanium (SiGe) substrates, and/or silicon-on-insulator (SOI) substrates. In some implementations, the substrate 203 and the substrate of the peripheral circuit chip 201 can respectively include same or different semiconductor materials, such as group IV semiconductor materials, group III-V compound semiconductor materials, group II-VI oxide semiconductor materials, etc. Group IV semiconductor materials can include Si, Ge, or SiGe. Optionally, the substrate 203 and the substrate of the peripheral circuit chip 201 can be bulk wafers or epitaxial layers, respectively.

The stack structure 290 can include a plurality of gate layers 295 and a plurality of insulating layers 294 that are alternately stacked. The gate layers 295 can be a laminated structure including a metal gate (MG) electrode wrapped by a gate insulator layer. The gate insulator layer can include any suitable dielectric materials such as high dielectric constant (high-k) materials. The insulating layer 294 can include any suitable insulating materials such as silicon nitride and/or silicon dioxide. The plurality of gate layers 295 and the plurality of insulating layers 294 can be configured to form a series of vertically stacked transistors in the Z direction, while each gate layer 295 can function as a gate electrode of one corresponding transistor.

The nonvolatile memory 200 can include one or more memory cell arrays and one or more peripheral circuits (e.g., a row decoder circuit 110, a page buffer circuit 120, a data I/O circuit 130, a voltage generator 140, a control circuit 150, etc.). The one or more peripheral circuits can be formed on the peripheral circuit chip 201, and the one or more memory cell arrays can be formed on the memory array chip 202. The memory array chip 202 can include a core region 01 and a staircase region 02. The one or more memory cell arrays can be formed in the core region 01 of the stack structure 290, and each can include a plurality of vertical memory cell strings 280. The staircase region 02 can be configured for forming contact structures to connect he gates of memory cells in the memory cell strings 280, the gates of select gate transistors, etc. The gates of the memory cells in the memory cell strings 280 can be used as word lines (WLs) in the memory architecture.

Each memory cell string 280 can include a channel structure 281 that penetrates the stack structure 200 and extends vertically (along the Z direction) into the substrate 203. That is, the channel structures 281 and the stack structure 290 together form the memory cell strings 280.

The channel structure 281 can include a functional layer and a semiconductor layer that both have a circular shape on the X-Y plane and extend into the substrate 203 in the Z direction. The functional layer can include a barrier layer (e.g., a silicon oxide layer), a charge storage layer (e.g., a silicon nitride layer), a tunnel insulating layer (e.g., a silicon oxide layer). The semiconductor layer can include any suitable semiconductor material, such as polycrystalline silicon or monocrystalline. The semiconductor material can be undoped, or doped by P-type or N-type impurities. In some implementations, the barrier layer can be formed on the sidewall of a channel hole for forming the channel structure 281. The channel hole can penetrate through the stack structure 290 and extend into the substrate 203. The charge storage layer, the tunnel insulating layer, the semiconductor layer, and an insulating filling structure can be sequentially formed on the sidewall of barrier layer. The insulating filling structure can include any suitable insulating material, such as silicon oxide and/or silicon nitride, and/or can include one or more air gaps.

The substrate 203 may include a well doped region 205, which can be a highly doped semiconductor layer used to form an electrical connection with the semiconductor layer in the channel structure 281. In some implementations, the well doped region 205 can be electrically connected to the bottom surface of the semiconductor layer in the channel structure 281. In some other implementations, the well doped region 205 can be electrically connected to the sidewall of the semiconductor layer in the channel structure 281. In some other implementations, the well doped region 205 can be electrically connected to the sidewall and bottom surface of the semiconductor layer in structure 281.

The well doped region 205 can be formed as a source electrode conductive connection of the memory cell strings 280. The well doped region 205 can include one or more layers and can be made of one or more silicon materials, such as intrinsic polysilicon, N-type doped silicon, or P-type doped silicon, etc. In some implementations, the well doped region 205 can include metal silicide to improve conductivity. The well doped region 205 can be conductively connected to the sources of multiple memory cell strings 280 to form an array common source (ACS). In some implementations, when the memory cell strings 280 are configured to enable a level erase operation, the well doped region 205 can extend and cover the core region and the staircase region of a block that includes the level of the corresponding level erase operation.

In some implementations, the vertically stacked transistors formed by the gate layer 295 and the insulating layer 294 can include memory cells (also referred as "memory cell transistors") and select gate transistors (e.g., one or more bottom select gates (B S G s) or top select gates (TSGs)). The semiconductor layer of the channel structure 281 described above can function as the channel of the transistors in the memory cell string 280, and the gate layer 295 can function as the gates of the transistors in the memory cell string 280.

The memory cells can have different threshold voltages based on the trapping carriers in a portion of the charge storage layer of the channel structure 281. The portion of the charge storage layer can functions as the floating gates of the memory cells. When a large amount of holes are captured (stored) in the floating gate of a memory cell transistor, the threshold voltage of the memory cell transistor is lower than a predefined value, such that the memory cell transistor is in an unprogrammed state corresponding to a logic "1" state (or referred as an erased state). When the holes are drained from the floating gate of the memory cell transistor, the threshold voltage of the memory cell is higher than the predefined value, such that the memory cell transistor is in a programmed state corresponding to a logic "0" state.

A memory cell transistor can include a control gate configured for controlling the channel, and include a drain and a source on each side of the channel. In some implementations, the upper side of the channel of the transistor can be used as the drain, and the lower side of the channel of the transistor can be used as the source. In some other implementations, the drain and the source can be switched under certain drive configurations. In some implementations, the TSG transistors can be connected to the upper drain of the memory cell transistors, and the BSG transistor can be connected to the lower source the memory cell transistors.

The one or more TSG transistors can be configured to couple/decouple memory cells in the memory cell strings 280 to the bit line. The one or more BSG transistors can be configured to couple/decouple memory cells in the memory cell strings 280 to the ACS.

Each BSG transistor can be controlled by a corresponding BSG. When the voltage applied to BSG is greater than a threshold voltage of BSG transistor, the BSG transistor is turned on, and the memory cell is coupled to the ACS. When the voltage applied to BSG is less than the threshold voltage of the BSG transistor, the BSG transistor is turned off, and the memory cell is decoupled from the ACS. Similarly, each TSG transistors can be controlled by a corresponding TSG.

In some implementations, the BSG transistors and the TSG transistors can be referred as select gate transistors.

In some implementations, each channel structures 281 can have a cylindrical shape. In the X-Y plane, a plurality of channel structures 281 can be arranged separately from each other to form a memory cell array. The array of the channel structures 281 can have any appropriate array shape, such as a matrix array shape along the X and/or Y directions, a zigzag array shape along the X and/or Y directions, a honeycomb (e.g., hexagonal) array shape in the X-y plane, etc. The memory cell array can be divided into a plurality of blocks by a plurality of gate line slit (GLS) structures 270 each having a distance from its adjacent channel structure 281 in the X direction. Each block can include multiple levels stacked along the Z direction. That is, a plurality of memory cell strings 280 can be formed as blocks, and each block can include a plurality of levels stacked vertically along the Z direction perpendicular to the top surface of substrate 203. Therefore, the memory cell strings 280 can include a plurality of memory cell sub-strings that are located at different levels respectively.

In some implementations, one or more redundancy levels can be provided between the plurality of levels. Each redundancy level can include at least one dummy memory cell. The dummy memory cells and the memory cells can be formed simultaneously by using same process. The dummy memory cells can be used for process and electrical buffering.

Figure 3:
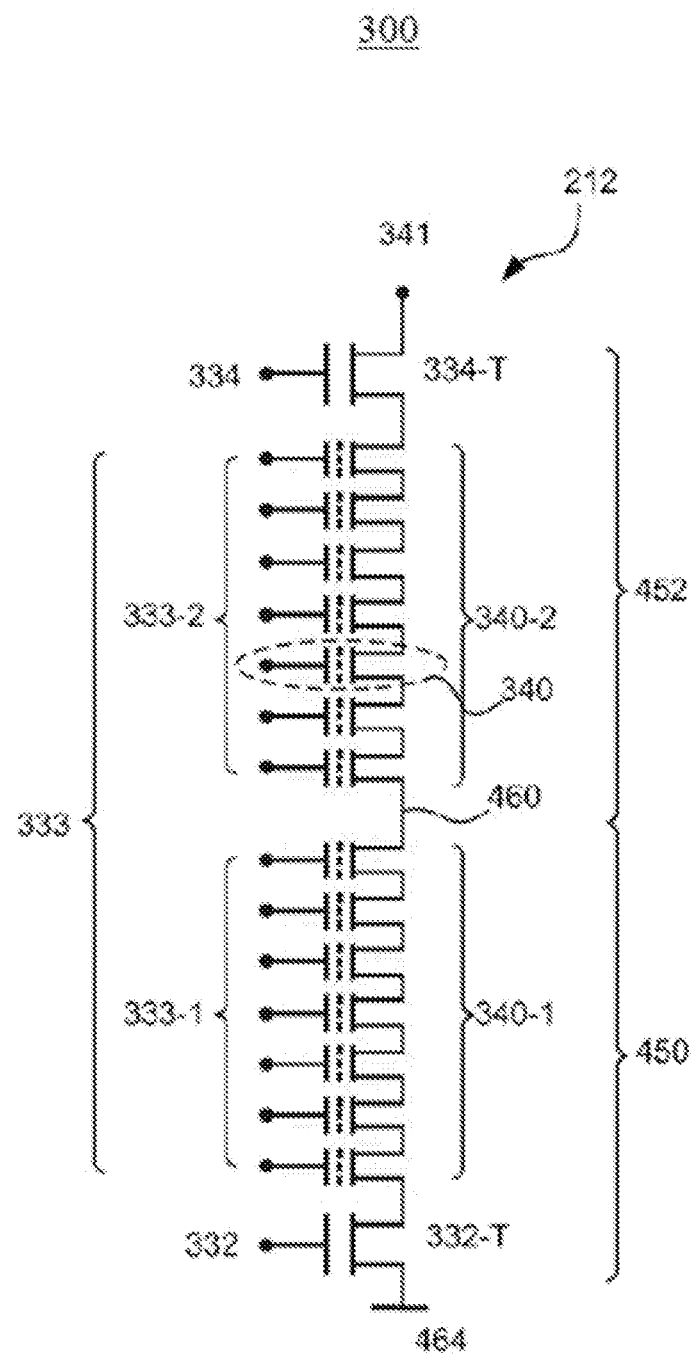
FIG. 3 is a schematic diagram of an equivalent circuit of a partial of a 3D memory device, according to an implementation of the present disclosure.

FIG. 3 shows a schematic diagram of an equivalent circuit of a partial of a 3D memory device 300, according to an implementation of the present disclosure.

As shown in FIG. 3, in some implementations, the 3D memory device 300 can include a plurality of blocks, and each block can include two levels or dual decks, such as a top level 452 and a bottom level 450. The 3D memory device 300 may further include a plurality of memory strings 212 each having a plurality of stacked memory cells 340. Each memory cell string 212 can include a plurality of memory cell sub-strings located in different levels respectively. The memory cell sub-string located in the bottom level 450 can include a lower group of memory cells 340-1, and the memory cell sub-string located in the top level 452 can include an upper group of memory cells 340-2.

The 3D memory device 300 can further include a conductive plug 460 between the top level 452 and the bottom level 450. As such, in the 3D memory device 300 having double levels, the memory cells 340-2 in the top level 452 can be electrically connected with the memory cells 340-1 in the bottom level 450 to form the memory string 212. The memory string 212 can include at least one field effect transistor (FET, e.g., MOSFET) at both ends. The at least two FETs can be controlled by the BSG 332 and the TSG 334, respectively. The two corresponding transistors cam be referred as BSG transistor 332-T and BSG transistor 334-T. The stacked memory cells 340 can be controlled by a plurality of control gates 333. The control gates 333 can includes a lower group of control gates 333-1 corresponding to the lower group of memory cells 340-1 and an upper group of control gates 333-2 corresponding to the upper group of memory cells 340-2. The plurality of control gates 333 can be connected to the word lines (WLs, not shown) of the 3D memory device 300. The drain of the TSG transistor 334-T can be connected to the bit line 341, and the source of the BSG transistor 332-T can be connected to the well doped region. Array common source (ACS) 464 can be formed from the well doped region and can be shared by the plurality of memory strings 212 in the block.

In a non-volatile memory device, the memory cells in each row in each level can be connected to a same word line (WL), and the memory cell strings in each column can be connected to a same bit line (BL). Each WL can correspond to a page. A block can include multiple pages, and a plane can include multiple blocks. Further, in a non-volatile memory device with multiple levels/decks, each level can be processed separately for effective read, write, and/or erase operations. For example, each level in a 3D non-volatile memory device can perform an erase operation independently from other levels. In addition, read and write operations can be performed in a memory page that includes a plurality of memory cells sharing a same WL.

The exemplary structures of a 3D non-volatile memory device including two levels are described above. In the following descriptions, exemplary data erasing methods for the 3D non-volatile memory device are described in detail with reference to the accompanying drawings, in accordance with some the implementations of the present disclosure.

Figure 4:
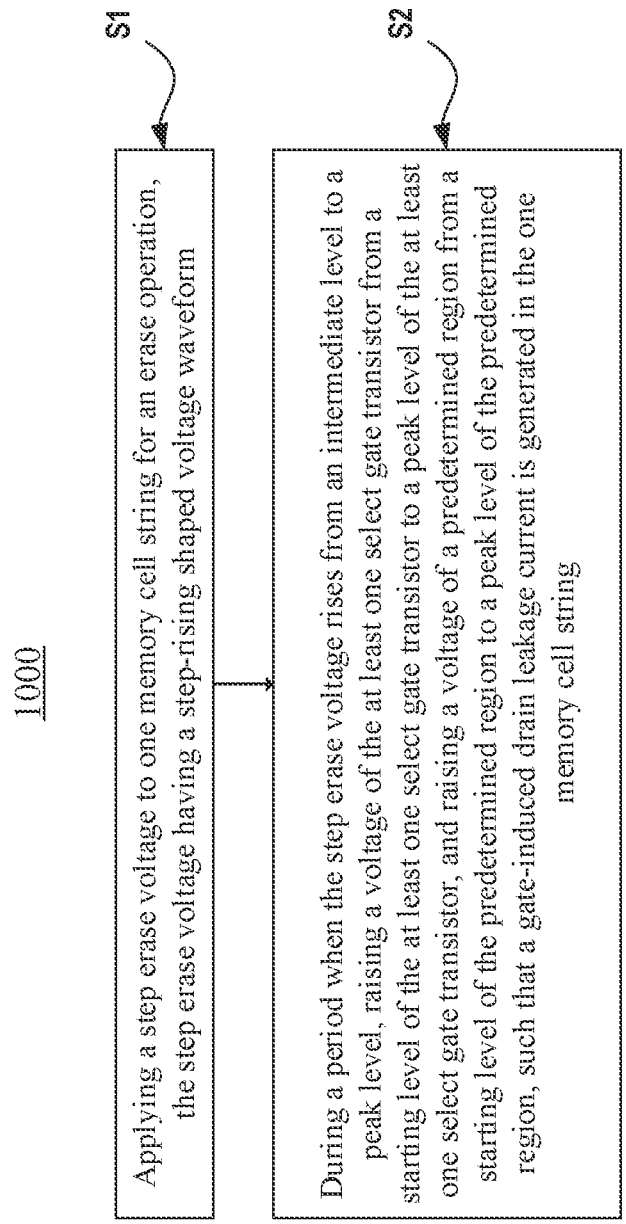
FIG. 4 is a flowchart of a data erasure method for a non-volatile memory device according to some implementations of the present disclosure.

FIG. 4 is a flowchart of a data erasure method 1000 for a non-volatile memory device according to some implementations of the present disclosure. As shown in FIG. 4, a data erase method 1000 for a non-volatile memory can include the following steps.

In step S1, a step erase voltage can be applied to a memory cell string for an erase operation. The step erase voltage can have step-rising shaped voltage waveform.

In step S2, during a period when the step erase voltage rises from an intermediate level to a peak level, the voltage of a select gate transistor of the memory cell string can be raised from a starting level to a first predetermined peak level, and the voltage of a predetermined region can be raised from a starting level to a second predetermined peak level. As such, a gate-induced drain leakage current can be generated in the memory cell string. The predetermined region can be adjacent to the select gate transistor of the memory cell string and can include at least one memory cell.

The two steps are described in detail below, so that those skilled in the art can more clearly know the specific implementation of the method 1000.

Step S1:

FIG. 5 is a partial circuit structure diagram of a non-volatile memory device according to some implementations of the present disclosure. FIG. 6 is a partial circuit structure diagram of a non-volatile memory according to some other implementations of the present disclosure.

In step S1, the non-volatile memory device can include a plurality of blocks. As shown in FIG. 5, the block can include a memory cell string 212 that includes a top level 452 and a bottom level 450. Any one of the two levels of the memory string 212 to be erased can be selected as a first level to perform a level erase operation. The entire block including the memory string 212 can also be selected to perform a data erase operation. A level erase operation is applied to at least one level of a block rather than applying to the entire block.

In some implementations of the present disclosure, the memory cell string 212 can include a plurality of memory cells connected in a sequentially in a string, a TSG transistor 334-T, and a BSG transistor 332-T. In FIGS. 5 and 6, TSG can represent an electrical signal applied to the TSG for controlling the TSG transistor 334-T, and BSG can represent an electrical signal applied to the BSG for controlling the BSG transistor 332-T.

In some implementations, one or more redundancy levels can be provided between multiple levels. The one or more redundancy levels can include at least one dummy memory cell (e.g., IDPDMY located between the top level 452 and the bottom level 450). The dummy memory cells and the memory cells can be formed simultaneously by using same process. The dummy memory cells can be used for process and electrical buffering.

In some implementations of the present disclosure, the memory cell string 212 can include a top select level including at least one TSG transistor 334-T. In some implementations, the top select level can include at least one TSG transistor 334-T and at least one TSG dummy memory cell 334'. The at least one TSG transistor 334-T and at least one TSG dummy memory cell 334' can be formed simultaneously by using same process, and used for process and electrical buffering. In FIGS. 5 and 6, TSG_DMY can represent an electrical signal applied to the gate of the TSG dummy memory cell 334'.

Similarly, in some implementations of the present disclosure, the memory cell string 212 can further include a bottom select level including at least one BSG transistor 332-T. In some implementations, the bottom select level can include at least one BSG transistor 332-T and at least one BSG dummy memory cell 332'. The at least one BSG transistor 332-T and at least one BSG dummy memory cell 332' can be formed simultaneously by using same process, and used for process and electrical buffering. In FIGS. 5 and 6, BSG_DMY can represent an electrical signal applied to the gate of the BSG dummy memory cell 332'.

The TSG dummy memory cell 334' and the BSG dummy memory cell 332' can be referred as select level dummy memory cells.

As shown in FIG. 6, the memory cell string 212 can further include a redundancy layer between the BSG transistor 332-T and the well doped region 205 of the substrate. The redundancy layer can include at least one first dummy memory cell 205'. The at least one first dummy memory cell 205' and the plurality of memory cells can be formed simultaneously by using same process, and used for process and electrical buffering. In FIG. 6, DMY can represent an electrical signal applied to a predetermined region of the redundancy layer including the dummy memory cell 205'.

FIGS. 7-10 are voltage waveform timing diagrams of a non-volatile memory device according to various implementations of the present disclosure.

As discussed above, the connection mode of channel layer bottom structure has evolved from traditional selective epitaxial structure to lateral connection mode or bottom connection mode. By forming a highly doped semiconductor layer (which usually has the same type of doping impurities as the channel layer) at the bottom of channel layer as a connecting structure, the non-volatile memory devices manufactured by the existing forming method are not suitable for volume erase operations. Therefore, gate-induced drain leakage (GIDL) is introduced to generate auxiliary body bias to assist erase operations in each level to achieve data erasing of non-volatile memory devices.

However, as the number of stacked layers of non-volatile memory device continues to increase, it is usually difficult for the erased carriers to reach the memory cells to be operated to achieve effective GIDL erasing.

The method for erasing non-volatile memory provided by the present disclosure can be achieved by applying an auxiliary voltage at a predetermined peak level to the select gate transistors and predetermined regions adjacent to the select gate transistors during a second time period of the data erase operation. A gate-induced drain leakage current can be generated in one or more memory cell strings for one or more data erase operations, so that the efficiency of level erase operations and/or gate-induced drain leakage erase operations can be realized.

Specifically, as shown in FIGS. 5 to 10, a step erase voltage having a step-rising shaped voltage waveform can be applied to a plurality of memory cell strings for data erase operations. For example, electrical signals having the step erase voltage can be applied to the bit line 341 corresponding to the memory cell string 212, and be applied to the well doped region 205, respectively.

Figure 7:
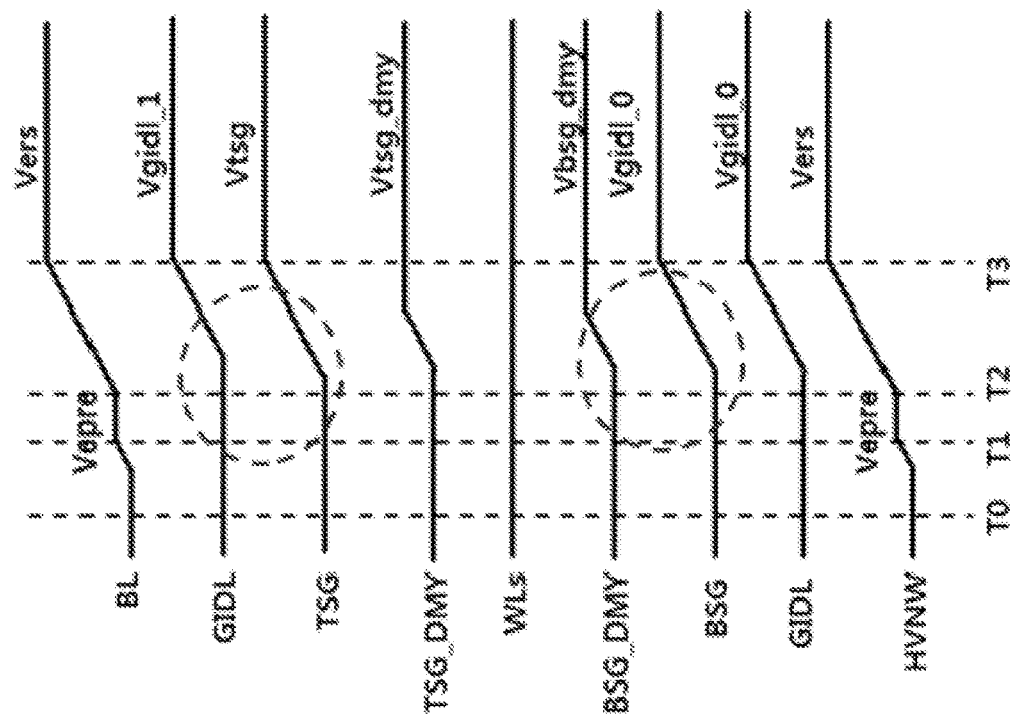

In one example as shown in FIG. 7, BL can represent the electrical signal applied to the bit line 341, and HVNW can represent the electrical signal applied to the well doped region 205. The step erase voltage can have a step-rising shaped voltage waveform, including a first step crossing a first time period from T0 to T2 with the voltage rising from a start level to an intermediate level Vepre, and a second step crossing a second time period from T2 to T3 with the voltage rising from the intermediate level Vepre to a peak level Vers. In some implementations, the value of the intermediate level Vepre can be within a range between about 1 volt and about 4 volts (e.g., 1.5 volt, 2 volt, 2.5 volt or 3 volt), and the value of the peak level Vers can be within a range between about 16 volts and about 22 volts (e.g., 18 volt, 19 volt or 20 volt). The second time period from T2 to T3 can be within a range between about 0.4 milliseconds and about 0.9 milliseconds (e.g., 0.5 milliseconds).

WLs can represent the electrical signals applied to the gates of the plurality of memory cells in the memory cell string 212. FIGS. 7 to 10 show the voltage waveform timing diagrams when the data erase operation is performed on the entire memory block including the memory cell string 212. When performing a data erase operation on the entire memory block, the gates of all memory cells in the memory block to be erased can be grounded or connected to a low voltage level.

In some implementations, the data erase operation provided in the present disclosure can also be applied for level data erase operations. When performing a level data erase operation, the gates of the memory cells in one level to be erased can be grounded or connected to a low voltage level. At the same time, the gates of memory cells included in other levels that do not perform the erase operation can be set to a floating state. When the circuit structure of other levels that are not in the erase operation is in a floating state and does not undertake any circuit interconnection function. The skilled in the art can understand that in the present disclosure, when an element (or part, component, member, etc.) is referred to as being in a floating state, such element (or part, component, member, etc.) is not form an electrical path with other components (or parts, components, components, etc.).

Step S2:

Referring to FIGS. 5, and 7-10, step S2 is described in details below. In step S2, during a period when the step erase voltage rises from an intermediate level to a peak level, the voltage of a select gate transistor of the memory cell string can be raised from a starting level to a first predetermined peak level, and the voltage of a predetermined region can be raised from a starting level to a second predetermined peak level. As such, a gate-induced drain leakage current can be generated in the memory cell string. The predetermined region can be adjacent to the select gate transistor of the memory cell string and can include at least one memory cell.

In some implementations, step S2 can further include the following operations. During the period when the voltages of the select gate transistors (e.g., TSG transistor 334-T and BSG transistor 332-T) are raised from a starting level to the peak levels (e.g., Vtsg and Vbsg), the voltages of predetermined regions of the memory cell string (e.g., first predetermined region 101 and second predetermined region 102) can be raised from a starting level to a second peak level (for example, Vgidl_0 or Vgidl_1).

That is, during the period when the voltage of the BSG transistor 332-T is raised from the starting level to the peak level Vbsg, the voltage of the first predetermined region 101 can be raised from the starting level to the peak level Vgidl_0. Alternatively, during the period when the voltage of the TSG transistor 334-T is raised from the starting level to the peak level Vtsg, the voltage of the second predetermined region 102 can be raised from the starting level to the peak level Vgidl_1.

Specifically, as shown in FIG. 5, in some implementations of the present disclosure, the select gate transistors can include the top select gate transistor 334-T connected to the bit line 341 and the bottom select gate transistor 332-T connected to the well doped region 205 in the substrate. Correspondingly, the predetermined regions can include at least a first predetermined region 101 and a second predetermined region 102. The first predetermined region 101 is adjacent to the BSG transistor 332-T and includes at least one memory cell. The second predetermined region 102 is adjacent to the TSG transistor 334-T and includes at least one memory cell. It is noted that, the memory cells included in each of the predetermined regions (e.g., the first predetermined region 101 and the second predetermined region 102) can be a dummy memory cell. In FIG. 5, GIDL represents an electrical signal applied to the gate of a memory cell in a predetermined region.

Figure 8:
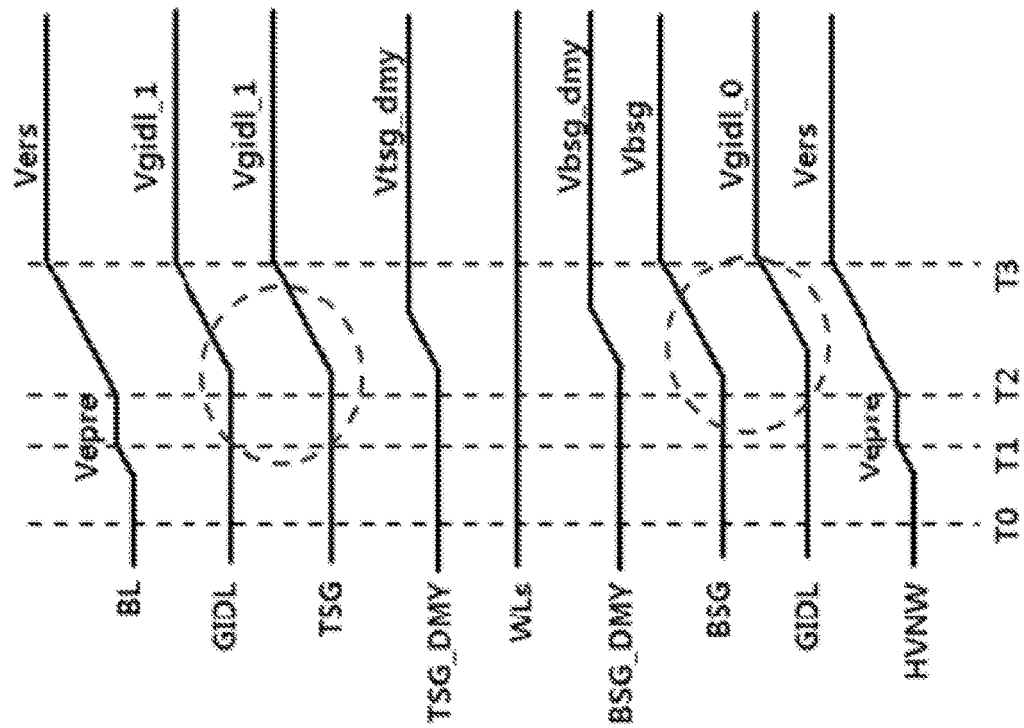
FIGS. 7-10, 11A-11B, 12A-12B, 13A-13B, and 14A-14B are voltage waveform timing diagrams of a non-volatile memory device according to various implementations of the present disclosure.
Figure 10:
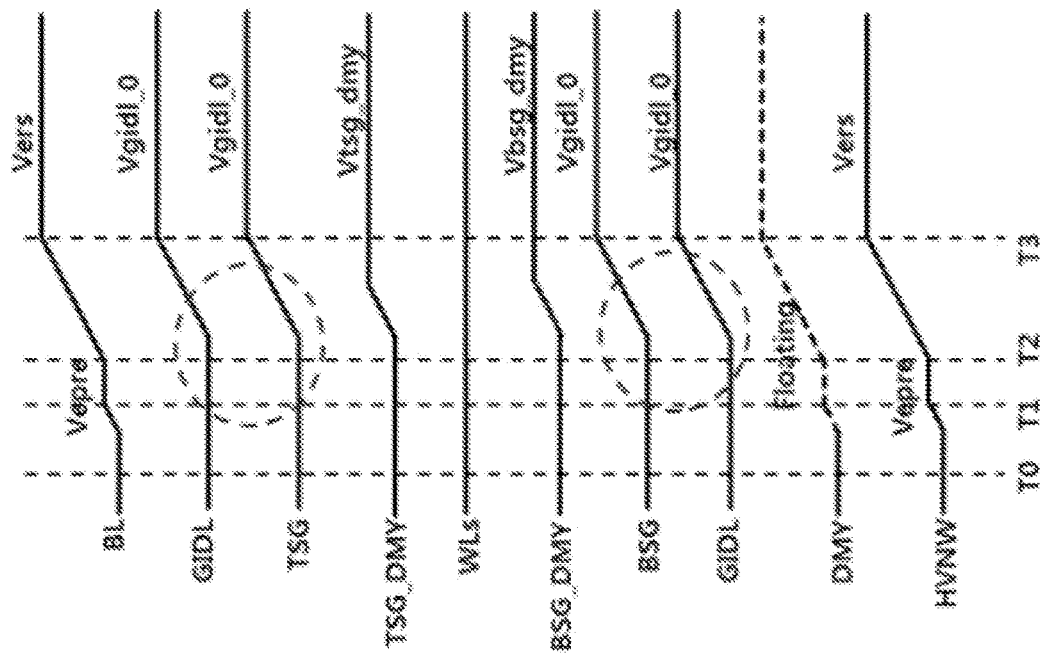
Figure 9:
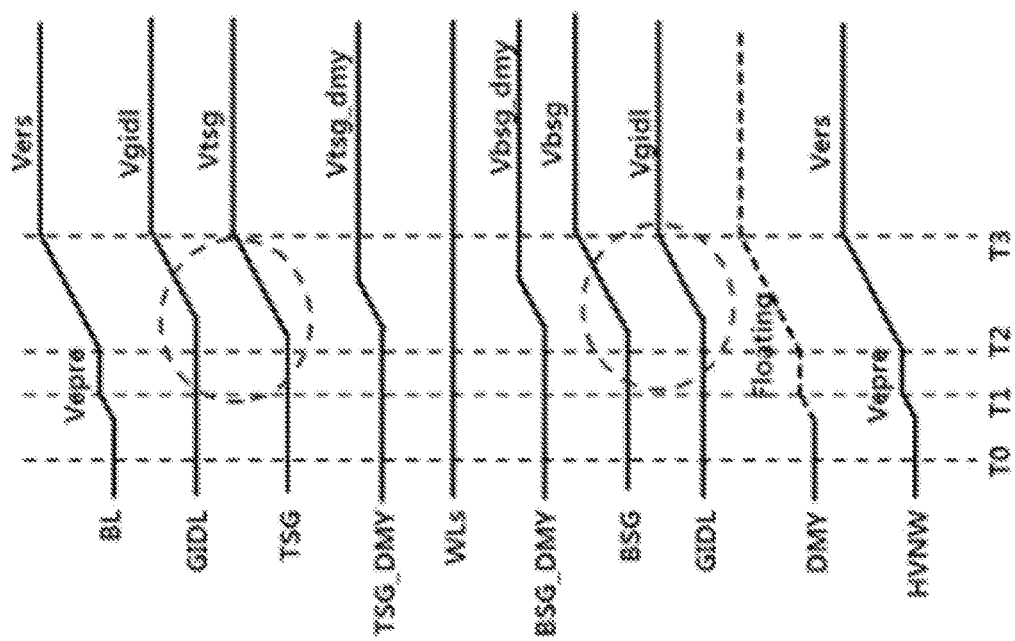

Referring to FIGS. 5 and 7-10, during the period from T2 to T3 in which the electrical signals BL and HVNW rise from the mid-level Vepre to the peak level Vers, the electrical signals TSG applied to the TSG transistor 334-T can raise from the starting level to a peak level Vtsg, and the electrical signal BSG applied to BSG transistor 332-T can raise from the starting level to a peak level (e.g., Vgidl_0 as shown in FIGS. 7 and 10 when BSG and GIDL have a same waveform, or Vbsg as shown in FIGS. 8 and 9 when BSG and GIDL have different waveforms). In some implementations, the starting level of the TSG transistor 334-T and the BSG transistor 332-T can be about 0 volt, and the values of the peak levels Vtsg and Vbsg can be within a range from about 2 volts to 12 volts (e.g., 5 volt, 7 volt, 9 volt or 11 volt).

Further, during the period from T2 to T3, the electrical signals GIDL applied to the first predetermined region 101 and the second predetermined region 102 respectively can raise from the starting level to a peak level Vgidl. In some implementations, the starting level of the first predetermined region and the second predetermined region can be about 0 volt, and the value of the peak level Vgidl can be within a range from about 8 volts to 15 volts (e.g., 9 volt, 10 volt or 14 volt).

In the second time period, by applying an auxiliary voltage (e.g., Vtsg, Vbsg, Vgidl) to the select gate transistors of the memory cell string and the predetermined regions adjacent to the select gate transistors, a gate-induced drain leakage current can be generated to realizing high-efficiency non-volatile memory level erase operation and gate induced drain leakage erase operation.

In some implementations, the voltage of select gate transistors (e.g., TSG transistor 334-T and BSG transistor 332-T) can be raised from the starting level to the peak level (e.g., Vtsg, Vbsg). At the same time, the voltage of the predetermined regions (e.g., the first predetermined region 101 and the second predetermined region 102) of the memory cell string 212 can be raised from the starting level to the peak level Vgidl. In some implementations, the peak levels Vtsg, Vbsg, and Vgidl can have a same value. It is noted that, by applying an auxiliary voltage (e.g., Vtsg, Vbsg, Vgidl) simultaneously to the select gate transistors of the memory cell string and the predetermined regions adjacent to the select gate transistors, the control circuit of the non-volatile memory can be simplified, and the operability of the data erase operations of the non-volatile memory can be improved.

In some other implementations, after raising the voltage of select gate transistors (e.g., TSG transistor 334-T and BSG transistor 332-T) from the starting level to the peak level (e.g., Vtsg, Vbsg), the voltage of the predetermined regions (e.g., the first predetermined region 101 and the second predetermined region 102) of the memory cell string 212 can be then raised from the starting level to the peak level Vgidl. It is noted that, by applying an auxiliary voltage (e.g., Vtsg, Vbsg, Vgidl) respectively to the select gate transistors of the memory cell string and the predetermined regions adjacent to the select gate transistors, the switching performance of the select gate transistors that function as the select switches of the memory cell string can be improved, and the crosstalk and leakage between adjacent memory cell strings can be avoided.

In some implementations as shown in the dotted circle in FIG. 7, in the top level 452, after the voltage of the TSG transistor 334-T is raised from the starting level, the voltage of the second predetermined region 102 can be raised from the starting level. The interval between the above two operations can be in a range of about 0.1 milliseconds to about 0.3 milliseconds. After the operations, the voltage of the TSG transistor 334-T can be raised to the predetermined peak level Vtsg, and the voltage of the second predetermined region 102 can be raised to the predetermined peak level Vgidl_1. In the bottom level 450, at the same time when the voltage of the BSG transistor 332-T is raised from the starting level to the predetermined peak level Vbsg, a the voltage of the first predetermined region 101 can also be raised from the starting level to the predetermined peak level Vgidl_0 simultaneously. The above two operations can be performed simultaneously, and the predetermined peak level Vbsg can be equal to the predetermined peak level Vgidl_0.

In some other implementations as shown in the dotted circle in FIG. 8, in the top level 452, at the same time when the voltage of the TSG transistor 334-T is raised from the starting level, the voltage of the second predetermined region 102 can also be raised from the starting level simultaneously. After that, the voltage of the TSG transistor 334-T can be raised to the predetermined peak level Vtsg, and the voltage of the second predetermined region 102 can be also raised to the predetermined peak level Vgidl_1. The above two operations can be performed simultaneously, and the predetermined peak level Vtsg can be equal to the predetermined peak level Vgidl_1. In the bottom level 450, after the voltage of the BSG transistor 332-T is raised from the starting level to the predetermined peak level Vbsg, the voltage of the first predetermined region 101 can then be raised from the starting level to the predetermined peak level Vgidl_0. The interval between the above two operations can be in a range of about 0.1 milliseconds to about 0.3 milliseconds. After the operations, the voltage of the BSG transistor 332-T can be raised to the predetermined peak level Vbsg, and the voltage of the first predetermined region 101 can be raised to the predetermined peak level Vgidl.

In some other implementations as shown in the dotted circle in FIG. 9, in the top level 452, after the voltage of the TSG transistor 334-T is raised from the starting level, the voltage of the second predetermined region 102 can be raised from the starting level. The interval between the above two operations can be in a range of about 0.1 milliseconds to about 0.3 milliseconds. After the operations, the voltage of the TSG transistor 334-T can be raised to the predetermined peak level Vtsg, and the voltage of the second predetermined region 102 can be raised to the predetermined peak level Vgidl. In the bottom level 450, after the voltage of the BSG transistor 332-T is raised from the starting level to the predetermined peak level Vbsg, the voltage of the first predetermined region 101 can then be raised from the starting level to the predetermined peak level Vgidl. The interval between the above two operations can be in a range of about 0.1 milliseconds to about 0.3 milliseconds. After the operations, the voltage of the BSG transistor 332-T can be raised to the predetermined peak level Vbsg, and the voltage of the first predetermined region 101 can be raised to the predetermined peak level Vgidl.

In some other implementations as shown in the dotted circle in FIG. 10, in the top level 452, at the same time when the voltage of the TSG transistor 334-T is raised from the starting level, the voltage of the second predetermined region 102 can also be raised from the starting level simultaneously. After that, the voltage of the TSG transistor 334-T can be raised to the predetermined peak level Vtsg, and the voltage of the second predetermined region 102 can be also raised to the predetermined peak level Vgidl. The above two operations can be performed simultaneously, and the predetermined peak level Vtsg can be equal to the predetermined peak level Vgidl. In the bottom level 450, at the same time when the voltage of the BSG transistor 332-T is raised from the starting level to the predetermined peak level Vbsg, a the voltage of the first predetermined region 101 can also be raised from the starting level to the predetermined peak level Vgidl simultaneously. The above two operations can be performed simultaneously, and the predetermined peak level Vbsg can be equal to the predetermined peak level Vgidl.

Referring again to FIGS. 5 and 7-10, in some implementations of the present disclosure, the memory cell string 212 can further include one or more dummy memory cells. The one or more dummy memory cells can include a bottom dummy memory cell 332' adjacent to the BSG transistor 332-T, and top dummy memory cell 334' adjacent to the TSG transistor 334-T. The dummy memory cells can be formed simultaneously as the formation of the select gate transistors, and can be used for process and electrical buffering.

In some implementations, during the period from T2 to T3 in which the electrical signals BL and HVNW are raised from the intermediate level Vepre to the peak level Vers, the electrical signals TSG_DMY and BSG_DMY can be applied to the top dummy memory cell 334' and the bottom dummy memory cell 332', respectively, such that the voltages of the top dummy memory cell 334' and the bottom dummy memory cell 332' can be raised from the starting level to the peak levels Vtsg_dmy and Vbsg_dmy, respectively. In some implementations, the value of the starting level of the top dummy memory cell 334' and the bottom dummy memory cell 332' can be 0 volt, and the values of the peak levels Vtsg_dmy and Vbsg_dmy can be in a range between about 2 volts and about 12 volts. By applying voltages to the select level dummy memory cells adjacent to the select gate transistors, the gate-induced drain leakage (GIDL) current can be increased due to the band-to-band tunneling, thereby achieving effective GIDL erase operations to improve the data erasing efficiency of non-volatility memory devices.

In some implementations of the present disclosure, during the period in which the voltages of the select gate transistors (e.g., the TSG transistor 334-T and the BSG transistor 332-T) are raised from the starting level to the predetermined peak levels (e.g., Vtsg and Vbsg), the voltages of the select level dummy memory cells (e.g., the top dummy memory cell 334' and the bottom dummy memory cell 332') can be raised from the starting level to the peak levels (for example, Vtsg_dmy And Vbsg_dmy).

In one example as shown in FIG. 7, during the period from T2 to T3, the TSG curve and TSG_DMY curve show that the operation of applying a voltage to the select level dummy memory cell and the operation of applying a voltage to the adjacent select gate transistor can be performed simultaneously. When the two operations are performed at the same time simultaneously, the control circuit of the non-volatile memory device can be simplified, and the operability of the data erasing method of the non-volatile memory device can be improved.

In another example as shown in FIG. 7, during the period from T2 to T3, the BSG curve and BSG_DMY curve show that the operation of applying a voltage to the select level dummy memory cell can be performed after applying a voltage to the adjacent select gate transistor. When the two operations are performed separately, the switching performance of the select gate transistor that functions as the select switches of the memory cell string can be improved while increasing the gate induced drain leakage current.

Referring to FIGS. 6, and 9-10, in some implementations of the present disclosure, a redundancy layer including at least one first dummy memory cell 205' can be provided between the BSG transistor 332-T and the well doped region 205 of the substrate. The first dummy memory cell in the redundancy layer and the memory cells can be formed simultaneously, which can be used for process and electrical buffering. In the figures, DMY can represent an electrical signal applied to a predetermined region of the redundancy layer that includes the first dummy memory cell 205'.

In some implementations, at least one first dummy memory cell 205' can be arranged between the first predetermined region 101 and the well doped region 205 of the substrate. As such, the adverse effect of the potential of the first predetermined region due to the process defects in the substrate can be avoided, and the adverse effect of the gate induced drain leakage (GIDL) current due to the process defects in the substrate can also be reduced.

In some implementations, during the data erase operation, the potential of the well doped region 205 of the substrate can be conducted by setting the first dummy memory cell 205' to a floating state. As such, the control circuit of the non-volatile memory device for increasing the GIDL current can be simplified, and the operability of the data erase operation of the non-volatile memory device can be improved. That is, the first dummy memory cell 205' in the floating state can obtain the predetermined peak level of the well doped region 205 of the substrate through voltage coupling during the data erase operation, thereby avoiding the adverse effect due to the process defects of the substrate, and obtaining better data erase result.

In some implementations, the electrical signal DMY can be directly applied to the first dummy memory cell 205' that functions as a gap. The electrical signal DMY can have the same step voltage waveform as the step erase voltage applied to the bit line 341 and the well doped region 205 of the substrate.

According to some implementations of the present disclosure, a first auxiliary voltage can be applied to the select gate transistors of the memory cell string, and a second auxiliary voltage can be applied to a predetermined region adjacent to the select gate transistor. Specifically, when the auxiliary voltages are applied to the select gate transistor of the memory cell string and the predetermined region adjacent to the select gate transistor respectively (e.g., the second auxiliary voltage is applied to the predetermined region adjacent to the select gate transistor after applying the first auxiliary voltage to the select gate transistor of the memory cell string), the switching performance of the select gate transistor that functions as a select switch of the memory cell string can be improved, and the crosstalk and leakage between adjacent memory cell strings can be avoided. When the operation of applying a voltage to the dummy memory cell and the operation of applying a voltage to the adjacent select gate transistor are performed simultaneously, the control circuit of the non-volatile memory device can be simplified, and the operability of the data erasing method of the non-volatile memory device can be improved.

Further, according to some implementations of the present disclosure, the predetermined region adjacent to the BSG transistor can be arranged close to the level to perform the data erase operation, such that the GIDL current can be increased and efficient data erase operation of non-volatile memory device can be achieved.

Referring to FIGS. 11A-11B, 12A-12B, 13A-13B, and 14A-14B, voltage waveform timing diagrams of a non-volatile memory device are illustrated according to various other implementations of the present disclosure.

Figure 11A:
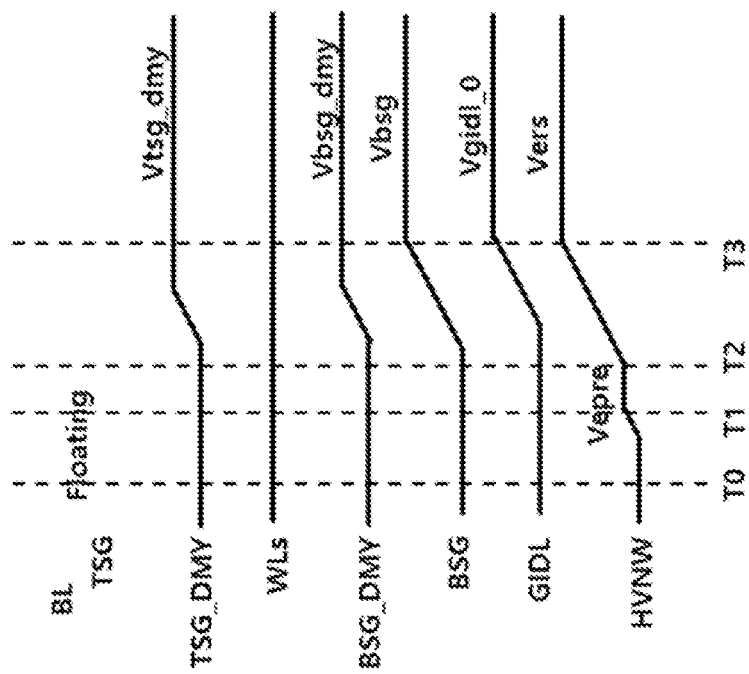
Figure 11B:
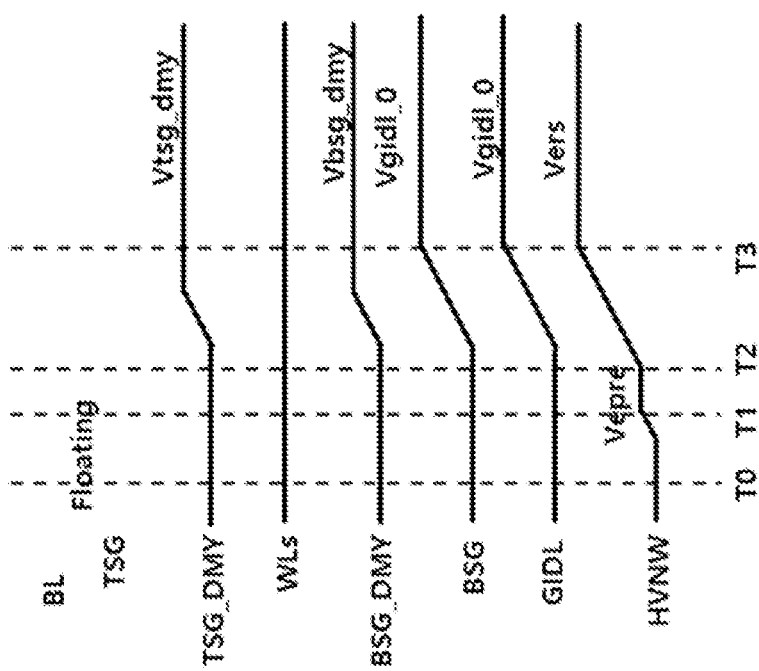

FIGS. 11A-11B illustrate voltage waveform timing diagrams of a non-volatile memory device during a bottom-side GIDL erase operation, according to some implementations of the present disclosure. As shown in FIGS. 11A and 11B, during the bottom-side GIDL erase operation, the bit line (BL) and the top select gate (TSG) can be at a floating state, and the word lines (WLs) can be kept at a low level (e.g., ground level). During the first time period from T0 to T1, the high-voltage drift n-well (HVNW) can be ramped from a low level (e.g., ground level) up to an intermediate level Vepre. During the second time period from T1 to T2, HVNW can be kept at the intermediate level Vepre. During the first and second time periods from T0 to T2, the dummy top select gate (TSG_DMY), the dummy bottom select gate (BSG_DMY), the bottom select gate (BSG), and the gate-induced drain leakage (GIDL) are all kept at a low level (e.g., ground level). During the third time period from T2 to T3, TSG_DMY can be ramped from a low level (e.g., ground level) up to a high level Vtsg_dmy, BSG_DMY can be ramped up from a low level (e.g., ground level) to a high level Vbsg_dmy, GIDL can be ramped up from a low level (e.g., ground level) to a high level Vgidl_0, and HVNW can be ramped up from the intermediate level Vepre up to a high level Vers. In some implementations as shown in FIG. 11A, during the third time period from T2 to T3, BSG can be ramped from a low level (e.g., ground level) up to a high level Vgidl_0, and can have a same waveform of GIDL. In some other implementations, as shown in FIG. 11B, during the third time period from T2 to T3, BSG can be ramped from a low level (e.g., ground level) up to a high level Vbsg, and can have a different waveform from GIDL.

Figure 12B:
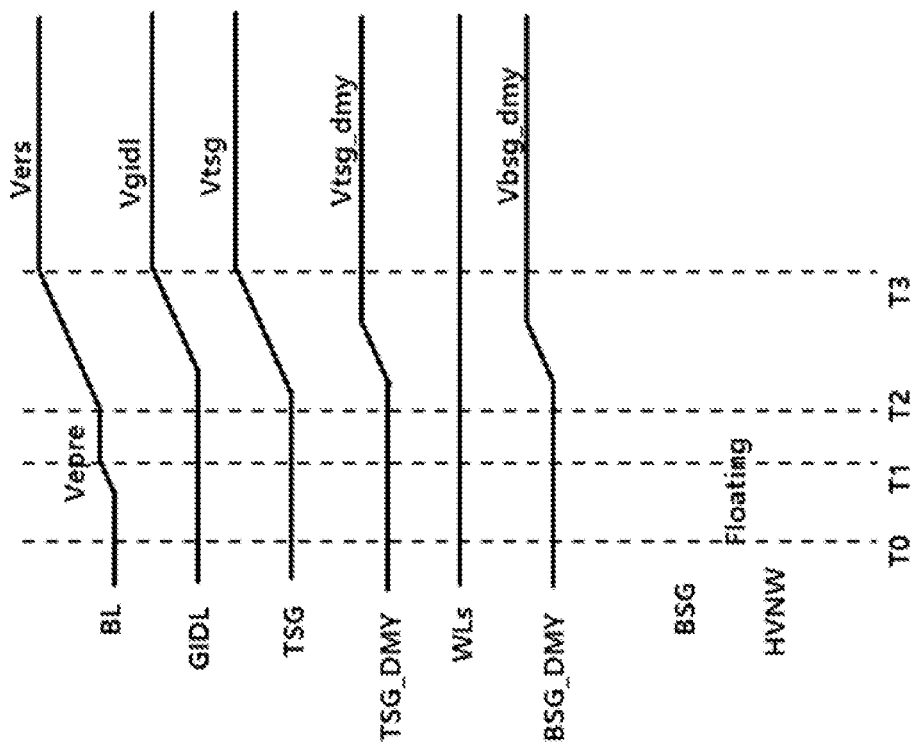
Figure 12A:
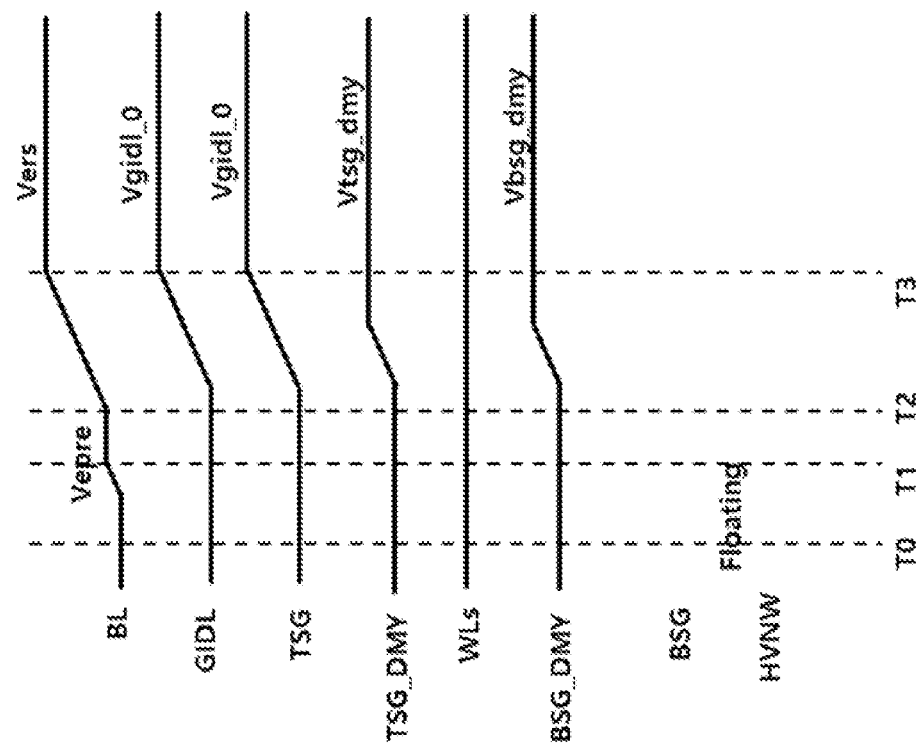

FIGS. 12A-12B illustrate voltage waveform timing diagrams of a non-volatile memory device during a top-side GIDL erase operation, according to some implementations of the present disclosure. As shown in FIGS. 12A and 12B, during the top-side GIDL erase operation, the bottom select gate (BSG) and the high-voltage drift n-well (HVNW) can be at a floating state, and the word lines (WLs) can be kept at a low level (e.g., ground level).

During the first time period from T0 to T1, the bit line (BL) can be ramped from a low level (e.g., ground level) up to an intermediate level Vepre. During the second time period from T1 to T2, BL can be kept at the intermediate level Vepre. During the first and second time periods from T0 to T2, the gate-induced drain leakage (GIDL), the dummy top select gate (TSG_DMY), the dummy bottom select gate (BSG_DMY), and the bottom select gate (BSG), all kept at a low level (e.g., ground level). During the third time period from T2 to T3, GIDL can be ramped up from a low level (e.g., ground level) to a high level Vgidl_0, TSG_DMY can be ramped from a low level (e.g., ground level) up to a high level Vtsg_dmy, and BSG_DMY can be ramped up from a low level (e.g., ground level) to a high level Vbsg_dmy. In some implementations as shown in FIG. 12A, during the third time period from T2 to T3, TSG can be ramped from a low level (e.g., ground level) up to a high level Vgidl_0, and can have a same waveform of GIDL. In some other implementations, as shown in FIG. 12B, during the third time period from T2 to T3, TSG can be ramped from a low level (e.g., ground level) up to a high level Vtsg, and can have a different waveform from GIDL.

Figure 13B:
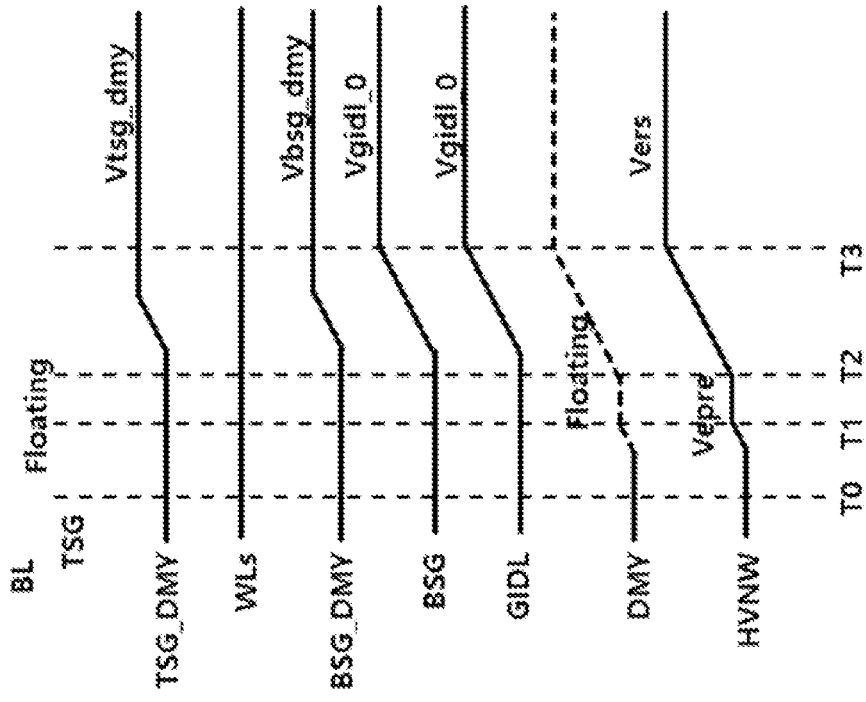
Figure 13A:
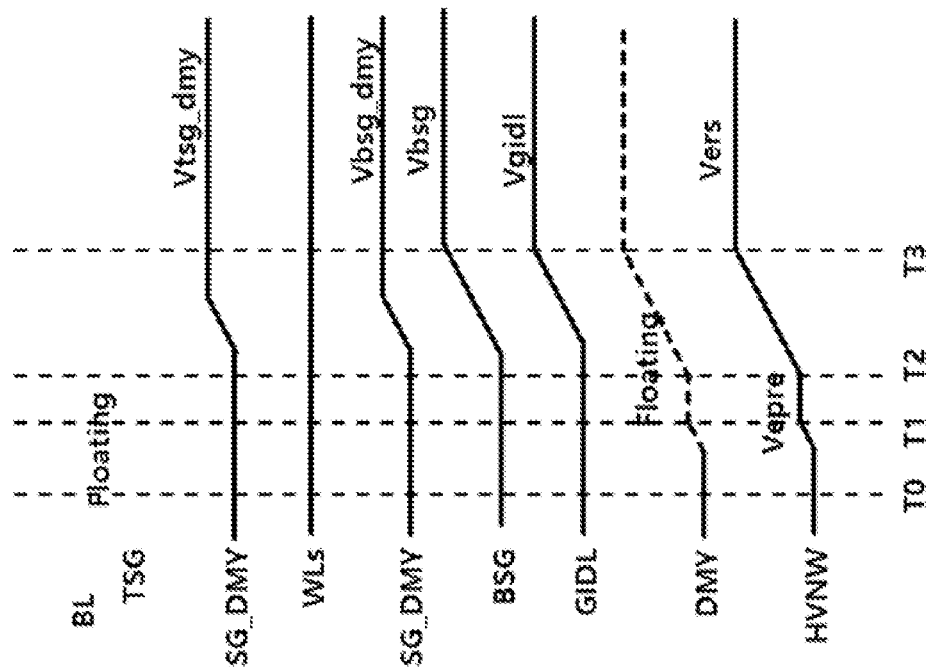

FIGS. 13A-13B illustrate voltage waveform timing diagrams of a non-volatile memory device during a bottom-side GIDL erase operation, according to some implementations of the present disclosure. As shown in FIGS. 13A and 13B, during the bottom-side GIDL erase operation, the bit line (BL), the top select gate (TSG), and the dummy memory cell 205' (DMY) can be at a floating state, and the word lines (WLs) can be kept at a low level (e.g., ground level).

During the first time period from T0 to T1, the high-voltage drift n-well (HVNW) can be ramped from a low level (e.g., ground level) up to an intermediate level Vepre. During the second time period from T1 to T2, HVNW can be kept at the intermediate level Vepre. During the first and second time periods from T0 to T2, the dummy top select gate (TSG_DMY), the dummy bottom select gate (BSG_DMY), the bottom select gate (BSG), and the gate-induced drain leakage (GIDL) are all kept at a low level (e.g., ground level). During the third time period from T2 to T3, TSG_DMY can be ramped from a low level (e.g., ground level) up to a high level Vtsg_dmy, BSG_DMY can be ramped up from a low level (e.g., ground level) to a high level Vbsg_dmy, GIDL can be ramped up from a low level (e.g., ground level) to a high level Vgidl_0, and HVNW can be ramped up from the intermediate level Vepre up to a high level Vers. In some implementations as shown in FIG. 13A, during the third time period from T2 to T3, BSG can be ramped from a low level (e.g., ground level) up to a high level Vgidl_0, and can have a same waveform of GIDL. In some other implementations, as shown in FIG. 13B, during the third time period from T2 to T3, BSG can be ramped from a low level (e.g., ground level) up to a high level Vbsg, and can have a different waveform from GIDL.

Figure 14B:
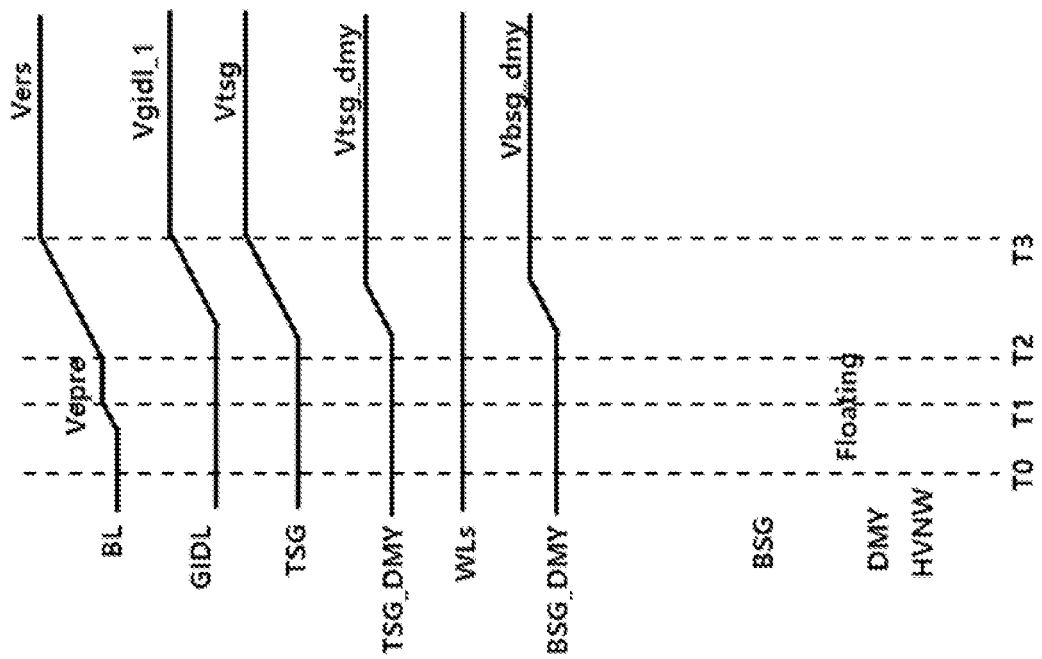
Figure 14A:
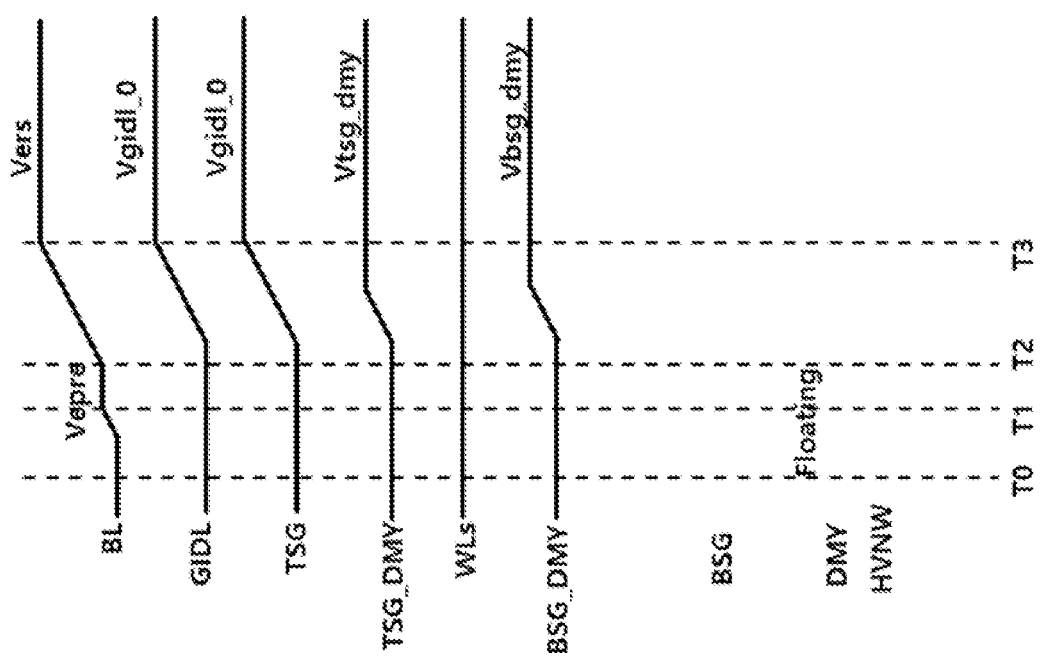

FIGS. 14A-14B illustrate voltage waveform timing diagrams of a non-volatile memory device during a top-side GIDL erase operation, according to some implementations of the present disclosure. As shown in FIGS. 14A and 14B, during the top-side GIDL erase operation, the bottom select gate (BSG), the high-voltage drift n-well (HVNW), and the dummy memory cell 205' (DMY) can be at a floating state, and the word lines (WLs) can be kept at a low level (e.g., ground level).

During the first time period from T0 to T1, the bit line (BL) can be ramped from a low level (e.g., ground level) up to an intermediate level Vepre. During the second time period from T1 to T2, BL can be kept at the intermediate level Vepre. During the first and second time periods from T0 to T2, the gate-induced drain leakage (GIDL), the dummy top select gate (TSG_DMY), the dummy bottom select gate (BSG_DMY), and the bottom select gate (BSG), all kept at a low level (e.g., ground level). During the third time period from T2 to T3, GIDL can be ramped up from a low level (e.g., ground level) to a high level Vgidl_0, TSG_DMY can be ramped from a low level (e.g., ground level) up to a high level Vtsg_dmy, and BSG_DMY can be ramped up from a low level (e.g., ground level) to a high level Vbsg_dmy. In some implementations as shown in FIG. 14A, during the third time period from T2 to T3, TSG can be ramped from a low level (e.g., ground level) up to a high level Vgidl_0, and can have a same waveform of GIDL. In some other implementations, as shown in FIG. 14B, during the third time period from T2 to T3, TSG can be ramped from a low level (e.g., ground level) up to a high level Vtsg, and can have a different waveform from GIDL.

Figure 15:
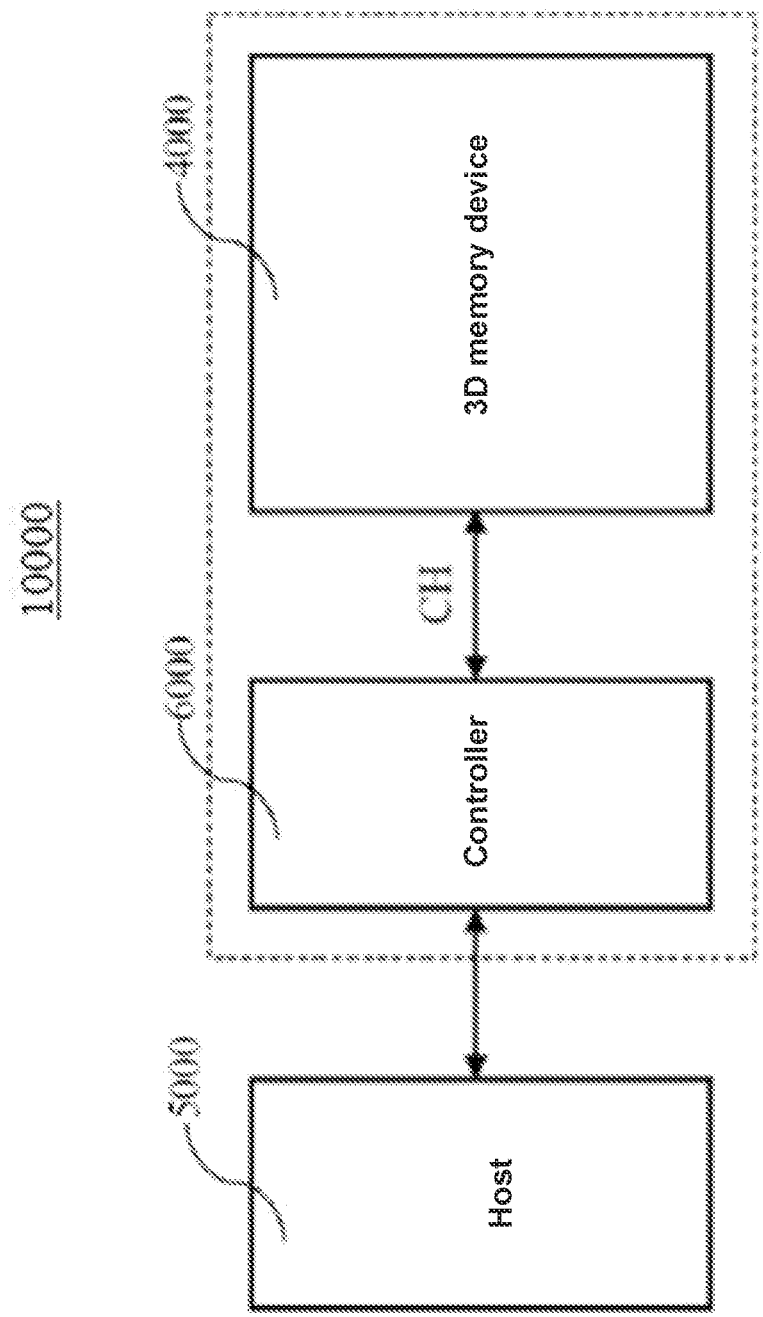
FIG. 15 is a schematic structural diagram of a memory system according to some implementations of the present disclosure.
Figure 16:
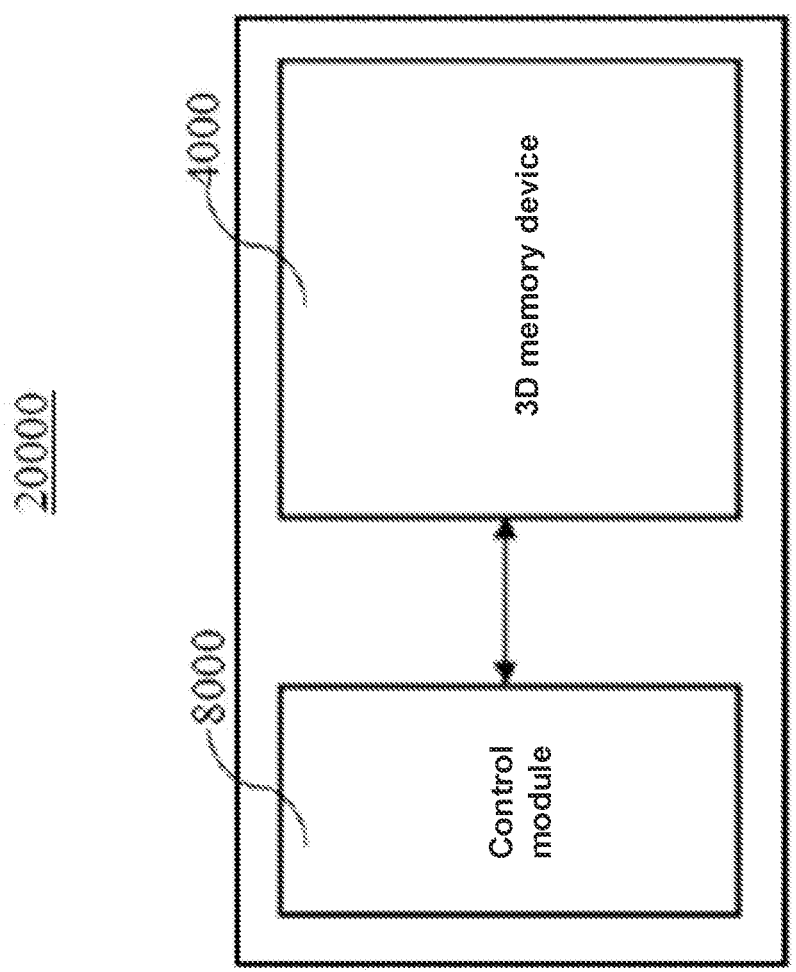
FIG. 16 is a schematic structural diagram of an electronic device according to some implementations of the present disclosure.

FIG. 15 is a schematic structural diagram of a memory system 10000 according to some implementations of the present disclosure. As shown in FIG. 11, the memory system 10000 can include a memory device 4000 and a controller 6000. The memory device 4000 can be the same non-volatile memory device described in any of the above implementations, which is not be repeated herein. The memory system 10000 can be a two-dimensional (2D) memory system or a three-dimensional (3D) memory. The followed descriptions use a 3D memory system as an example.

The 3D memory system 10000 can include a 3D memory device 4000, a host 5000 and a controller 6000. The 3D memory device 4000 can be the same non-volatile memory device described in any of the above implementations, which is not be repeated herein. The controller 6000 can control the 3D memory deice 4000 through the channel CH. The 3D memory device 4000 can perform operations based on the commands of the controller 6000 in response to a request from the host 5000. The 3D memory device 4000 can receive a command CMD and an address ADDR from the controller 5000 through the channel CH, and can access certain region selected from the memory cell array in response to the address. That is, the 3D memory device 4000 can perform an internal operation corresponding to the command on the region selected based on the address.

In some implementations, the 3D memory system can have any suitable form, such as multimedia card, Universal Flash Storage (UFS) device, solid state drive (SSD), MMC, eMMC, RS-MMC, micro MMC, SD, mini SD, micro SD, secure digital card, personal computer memory card international association (PCMCIA) type storage device, peripheral component interconnect (PCI) type storage device, high-speed PCI (PCI-E) type storage device, compact flash memory (CF) card, smart media card, memory stick, etc.

FIG. 12 is a schematic structural diagram of an electronic device 20000 according to some implementations of the present disclosure. As shown in FIG. 12, the electronic device 20000 can include memory 4000. The memory 4000 can be the same as the memory described in any of the above implementations, which is not be repeated herein. The electronic device 20000 can be mobile phone, desktop computer, tablet computer, notebook computer, server, in-vehicle device, wearable device, mobile power supply, or any other device with a digital storage function. Therefore, a control module 8000 of the electronic device 20000 can be determined according to the specific device type of the electronic device 20000. The control module 8000 can control the 3D memory device 4000 through various channels, and the 3D memory device 4000 can receive commands CMD and addresses ADDR from the control module 8000 through various channels, and access the region selected from the memory cell array based on the address, which are not limited by this disclosure.

The disclosure provides a memory, a storage system, and an electronic device. Since the data erasing method of the non-volatile memory provided by any of the above-mentioned implementations of the disclosure is adopted, the data erasing method of the non-volatile memory is the same as the data erasing method of the non-volatile memory. The beneficial effects will not be repeated here.

One aspect of the present disclosure provides a method for data erasing of a non-volatile memory device. The memory includes a plurality of memory cell strings each including at least one select gate transistor and a plurality of memory cells that are connected in series. The method comprises applying a step erase voltage to one memory cell string for an erase operation, the step erase voltage having a step-rising shaped voltage waveform. The method further comprises, during a period when the step erase voltage rises from an intermediate level of the step erase voltage to a peak level of the step erase voltage, raising a voltage of the at least one select gate transistor from a starting level of the at least one select gate transistor to a peak level of the at least one select gate transistor, and raising a voltage of a predetermined region from a starting level of the predetermined region to a peak level of the predetermined region, such that a gate-induced drain leakage current is generated in the one memory cell string. The predetermined region is adjacent to the at least one select gate transistor and includes at least one of the plurality of memory cells.

In some implementations, the at least one select gate transistor includes a top select gate (TSG) transistor connected to a bit line and/or a bottom select gate (BSG) transistor connected to a well doped region in a substrate, and the predetermined region includes a first predetermined region and a second predetermined region, wherein the first predetermined region is adjacent to the BSG transistor and includes at least one of the plurality of the memory cells, and the second predetermined region is adjacent to the TSG transistor and includes at least one of the plurality of memory cells.

In some implementations, raising the voltage of the at least one select gate transistor and raising the voltage of the predetermined region comprises: during a period in which the voltage of the at least one select gate transistor is raised from the starting level of the at least one select gate transistor to the peak level of the at least one select gate transistor, raising the voltage of the predetermined region from the starting level of the predetermined region to the peak level of the predetermined region.

In some implementations, raising the voltage of the at least one select gate transistor and raising the voltage of the predetermined region comprises: simultaneously raising the voltage of the at least one select gate transistor from the starting level of the at least one select gate transistor to the peak level of the at least one select gate transistor and raising the voltage of the predetermined region from the starting level of the predetermined region to the peak level of the predetermined region, where in the peak level of the at least one select gate transistor is equal to the peak level of the predetermined region.

In some implementations, raising the voltage of the at least one select gate transistor and raising the voltage of the predetermined region comprises: after raising the voltage of the at least one select gate transistor from the starting level of the at least one select gate transistor, raising the voltage of the predetermined region from the starting level of the predetermined region.

In some implementations, the plurality of memory cells include at least one dummy memory cell; the at least one dummy memory cell further comprises at least one first dummy memory cell located between the BSG transistor and the well doped region; and the first predetermined region is adjacent to the BSG transistor and includes the at least one dummy memory cell, and is spaced from the substrate by the at least one first dummy memory cell.

In some implementations, the method further comprises setting the at least one of the first dummy memory cell to a floating state during the erase operation.

In some implementations, the method further comprises applying another step erase voltage to the at least one of the first dummy memory cell.

In some implementations, the at least one dummy memory cell further includes at least one select level dummy memory cell adjacent to the at least one select gate transistor.

In some implementations, the method further comprises during the period when the step erase voltage rises from the intermediate level to the peak level, raising the voltage of the at least one select level dummy memory cell from the starting level of the at least one select level dummy memory cell to a peak level of the at least one select level dummy memory cell.

In some implementations, the method further comprises, during the period when the voltage of the at least one select gate transistor is raised from the starting level of the at least one select gate transistor to the peak level of the at least one select gate transistor, raising the voltage of the at least one select level dummy memory cell from the starting level of the at least one select level dummy memory cell to the peak level of the at least one select level dummy memory cell.

In some implementations, the method further comprises raising simultaneously, the voltage of the at least one select gate transistor from the starting level of the at least one select gate transistor to the peak level of the at least one select gate transistor, and the voltage of the at least one select level dummy memory cell from the starting level of the at least one select level dummy memory cell to the peak level of the at least one select level dummy memory cell.

In some implementations, the method further comprises, after raising the voltage of the at least one select gate transistor from the starting level of the at least one select gate transistor, raising the voltage of the at least one select level dummy memory cell from the starting level of the at least one select level dummy memory cell.

In some implementations, raising the voltage of the at least one select gate transistor and raising the voltage of the predetermined region comprises: during a period when a voltage of the BSG transistor is raised from a starting level of the BSG transistor to a peak level of the BSG transistor, raising a voltage of the first predetermined region is raised from a starting level of the first predetermined region to a peak level of the first predetermined region; and during a period when the voltage of the TSG transistor from a starting level of the TSG transistor to a peak level of the TSG transistor, raising a voltage of the second predetermined region from a starting level of the second predetermined region to a peak level of the second predetermined region.

In some implementations, raising the voltage of the at least one select gate transistor and raising the voltage of the predetermined region comprises: after raising the voltage of the BSG transistor from the starting level of the BSG transistor, raising the voltage of the first predetermined region from the starting level of the first predetermined region; and raising simultaneously, the voltage of the TSG transistor from the starting level of the TSG transistor to the peak level of the TSG transistor, and the voltage of the second predetermined region from the starting level of the second predetermined region to the peak level of the second predetermined region.

In some implementations, raising the voltage of the at least one select gate transistor and raising the voltage of the predetermined region comprises: raising simultaneously, the voltage of the BSG transistor from the starting level of the BSG transistor to the peak level of the BSG transistor, and the voltage of the first predetermined region from the starting level of the first predetermined region to the peak level of the first predetermined region; and after raising the voltage of the TSG transistor from the starting level of the TSG transistor, raising the voltage of the second predetermined region from the starting level of the second predetermined region.

In some implementations, raising the voltage of the at least one select gate transistor and raising the voltage of the predetermined region comprises: raising simultaneously, the voltage of the BSG transistor from the starting level of the BSG transistor to the peak level of the BSG transistor, and the voltage of the first predetermined region from the starting level of the first predetermined region to the peak level of the first predetermined region; and raising simultaneously, the voltage of the TSG transistor from the starting level of the TSG transistor to the peak level of the TSG transistor, and the voltage of the second predetermined region from the starting level of the second predetermined region to the peak level of the second predetermined region.

In some implementations, raising the voltage of the at least one select gate transistor and raising the voltage of the predetermined region comprises: after raising the voltage of the BSG transistor from the starting level of the BSG transistor, raising the voltage of the first predetermined region from the starting level of the first predetermined region; and after raising the voltage of the TSG transistor from the starting level of the TSG transistor, raising the voltage of the second predetermined region from the starting level of the second predetermined region.

Another aspect of the present disclosure provides a non-volatile memory device, comprising: a memory array formed on a well doped region of a substrate, comprising a plurality of blocks, wherein each block includes a plurality of memory cell strings each including a plurality of memory cells connected in series to a corresponding bit line, and each block include one or more levels stacked vertically in a direction perpendicular to the substrate; and a peripheral circuit coupled to the memory array and configured to control a level selection of the plurality of levels, and to perform the level erase operation and the level described above to the selected level.

In some implementations, the memory array is a three-dimensional NAND memory array, and the non-volatile memory device is a three-dimensional NAND memory device.

In some implementations, each block include two levels stacked vertically in the direction perpendicular to the substrate.

In some implementations, each block include three or more levels stacked vertically in the direction perpendicular to the substrate.

Another aspect of the present disclosure provides a memory system, comprising: a memory device described above, and; a controller coupled to the memory device and configured to control the memory device to store data.

Another aspect of the present disclosure provides an electronic device, comprising: the memory device described above.

The foregoing description of the specific implementations will so fully reveal the general nature of the present disclosure that others can, by applying knowledge within the skill of the art, readily modify and/or adapt, for various disclosures, such specific implementations, without undue experimentation, and without departing from the general concept of the present disclosure. Therefore, such adaptations and modifications are intended to be within the meaning and range of equivalents of the disclosed implementations, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Implementations of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary implementations of the present disclosure as contemplated by the inventor(s), and thus, are not intended to limit the present disclosure and the appended claims in any way.

The breadth and scope of the present disclosure should not be limited by any of the above-described exemplary implementations, but should be defined only in accordance with the following claims and their equivalents.

What is claimed is:

1. A method for data erasing of a non-volatile memory device, wherein the memory includes a plurality of memory cell strings each including at least one select gate transistor and a plurality of memory cells that are connected in series, the method comprising:
    applying a step erase voltage to one memory cell string for an erase operation, the step erase voltage having a step-rising shaped voltage waveform; and
    during a period when the step erase voltage rises from an intermediate level of the step erase voltage to a peak level of the step erase voltage, raising a voltage of the at least one select gate transistor from a starting level of the at least one select gate transistor to a peak level of the at least one select gate transistor, and raising a voltage of a predetermined region from a starting level of the predetermined region to a peak level of the predetermined region, such that a gate-induced drain leakage current is generated in the one memory cell string, wherein the peak level of the at least one select gate transistor is equal to the peak level of the predetermined region;
    wherein the predetermined region is adjacent to the at least one select gate transistor and includes at least one of the plurality of memory cells.

2. The method of claim 1, wherein:
    the at least one select gate transistor includes a top select gate (TSG) transistor connected to a bit line and/or a bottom select gate (BSG) transistor connected to a well doped region in a substrate; and
    the predetermined region includes a first predetermined region and a second predetermined region, wherein the first predetermined region is adjacent to the BSG transistor and includes at least one of the plurality of the memory cells, and the second predetermined region is adjacent to the TSG transistor and includes at least one of the plurality of memory cells.

3. The method of claim 2, wherein:
    the plurality of memory cells include at least one dummy memory cell;
    the at least one dummy memory cell further comprises at least one first dummy memory cell located between the BSG transistor and the well doped region; and
    the first predetermined region is adjacent to the BSG transistor and includes the at least one dummy memory cell, and is spaced from the substrate by the at least one first dummy memory cell.

4. The method according to claim 3, further comprising:
    setting the at least one of the first dummy memory cell to a floating state during the erase operation.

5. The method according to claim 3, further comprising:
    applying another step erase voltage to the at least one of the first dummy memory cell.

6. The method of claim 3, wherein:
    the at least one dummy memory cell further includes at least one select level dummy memory cell adjacent to the at least one select gate transistor; and
    the method further comprising:
        during the period when the step erase voltage rises from the intermediate level to the peak level, raising the voltage of the at least one select level dummy memory cell from the starting level of the at least one select level dummy memory cell to a peak level of the at least one select level dummy memory cell.

7. The method of claim 6, further comprising:
    during the period when the voltage of the at least one select gate transistor is raised from the starting level of the at least one select gate transistor to the peak level of the at least one select gate transistor, raising the voltage of the at least one select level dummy memory cell from the starting level of the at least one select level dummy memory cell to the peak level of the at least one select level dummy memory cell.

8. The method of claim 7, further comprising:
    raising simultaneously, the voltage of the at least one select gate transistor from the starting level of the at least one select gate transistor to the peak level of the at least one select gate transistor, and the voltage of the at least one select level dummy memory cell from the starting level of the at least one select level dummy memory cell to the peak level of the at least one select level dummy memory cell.

9. The method of claim 7, further comprising:
    after raising the voltage of the at least one select gate transistor from the starting level of the at least one select gate transistor, raising the voltage of the at least one select level dummy memory cell from the starting level of the at least one select level dummy memory cell.

10. The method of claim 2, wherein raising the voltage of the at least one select gate transistor and raising the voltage of the predetermined region comprises:
- during a period when a voltage of the BSG transistor is raised from a starting level of the BSG transistor to a peak level of the BSG transistor, raising a voltage of the first predetermined region from a starting level of the first predetermined region to a peak level of the first predetermined region; and
- during a period when the voltage of the TSG transistor from a starting level of the TSG transistor to a peak level of the TSG transistor, raising a voltage of the second predetermined region from a starting level of the second predetermined region to a peak level of the second predetermined region.

11. The method of claim 10, wherein raising the voltage of the at least one select gate transistor and raising the voltage of the predetermined region comprises:
- after raising the voltage of the BSG transistor from the starting level of the BSG transistor, raising the voltage of the first predetermined region from the starting level of the first predetermined region; and
- raising simultaneously, the voltage of the TSG transistor from the starting level of the TSG transistor to the peak level of the TSG transistor, and the voltage of the second predetermined region from the starting level of the second predetermined region to the peak level of the second predetermined region.

12. The method of claim 10, wherein raising the voltage of the at least one select gate transistor and raising the voltage of the predetermined region comprises:
- raising simultaneously, the voltage of the BSG transistor from the starting level of the BSG transistor to the peak level of the BSG transistor, and the voltage of the first predetermined region from the starting level of the first predetermined region to the peak level of the first predetermined region; and
- after raising the voltage of the TSG transistor from the starting level of the TSG transistor, raising the voltage of the second predetermined region from the starting level of the second predetermined region.

13. The method of claim 10, wherein raising the voltage of the at least one select gate transistor and raising the voltage of the predetermined region comprises:
- raising simultaneously, the voltage of the BSG transistor from the starting level of the BSG transistor to the peak level of the BSG transistor, and the voltage of the first predetermined region from the starting level of the first predetermined region to the peak level of the first predetermined region; and
- raising simultaneously, the voltage of the TSG transistor from the starting level of the TSG transistor to the peak level of the TSG transistor, and the voltage of the second predetermined region from the starting level of the second predetermined region to the peak level of the second predetermined region.

14. The method of claim 10, wherein raising the voltage of the at least one select gate transistor and raising the voltage of the predetermined region comprises:
- after raising the voltage of the BSG transistor from the starting level of the BSG transistor, raising the voltage of the first predetermined region from the starting level of the first predetermined region; and
- after raising the voltage of the TSG transistor from the starting level of the TSG transistor, raising the voltage of the second predetermined region from the starting level of the second predetermined region.

15. The method of claim 1, wherein raising the voltage of the at least one select gate transistor and raising the voltage of the predetermined region comprises:
- during a period in which the voltage of the at least one select gate transistor is raised from the starting level of the at least one select gate transistor to the peak level of the at least one select gate transistor, raising the voltage of the predetermined region from the starting level of the predetermined region to the peak level of the predetermined region.

16. The method of claim 15, wherein raising the voltage of the at least one select gate transistor and raising the voltage of the predetermined region comprises:
- simultaneously raising the voltage of the at least one select gate transistor from the starting level of the at least one select gate transistor to the peak level of the at least one select gate transistor and raising the voltage of the predetermined region from the starting level of the predetermined region to the peak level of the predetermined region.

17. The method of claim 15, wherein raising the voltage of the at least one select gate transistor and raising the voltage of the predetermined region comprises:
- after raising the voltage of the at least one select gate transistor from the starting level of the at least one select gate transistor, raising the voltage of the predetermined region from the starting level of the predetermined region.

18. A non-volatile memory device, comprising:
- a memory array formed on a well doped region of a substrate, comprising a plurality of blocks, wherein each block includes a plurality of memory cell strings each including a plurality of memory cells connected in series to a corresponding bit line, and each block include one or more levels stacked vertically in a direction perpendicular to the substrate; and
- a peripheral circuit coupled to the memory array and configured to control a level selection of the plurality of levels, and to perform the level erase operation and the level according to claim 1 to the selected level.

19. The non-volatile memory device of claim 18, wherein the memory array is a threedimensional NAND memory array, and the non-volatile memory device is a three-dimensional NAND memory device.

20. The non-volatile memory of claim 18, wherein each block include two levels stacked vertically in the direction perpendicular to the substrate.

21. The non-volatile memory of claim 18, wherein each block include three or more levels stacked vertically in the direction perpendicular to the substrate.

22. A memory system, comprising:
- a memory device according to claim 18; and
- a controller coupled to the memory device and configured to control the memory device to store data.

23. An electronic device, comprising: the memory device according to claim 18.

* * * * *